United States Patent [19]
White

[11] Patent Number: 5,361,036
[45] Date of Patent: Nov. 1, 1994

[54] COMPLEX DIGITAL DEMODULATOR EMPLOYING CHEBYCHEV-APPROXIMATION DERIVED SYNTHETIC SINUSOID GENERATION

[75] Inventor: Stanley A. White, San Clemente, Calif.

[73] Assignee: Rockwell International Corporation, Seal Beach, Calif.

[21] Appl. No.: 105,326

[22] Filed: Aug. 12, 1993

[51] Int. Cl.$^5$ .................. H03D 1/00; G01P 15/09
[52] U.S. Cl. ...................... 329/361; 329/356; 364/566; 73/489
[58] Field of Search ............... 329/361, 304, 308, 309, 329/357, 345, 346, 310, 305, 306, 307, 356; 340/669, 870.05, 870.3, 870.06; 324/162, 727; 310/318; 364/426.01, 566; 73/489, 514, 517 R, 517 AV, 517 A, 518

[56] References Cited

U.S. PATENT DOCUMENTS

| | | | |
|---|---|---|---|
| Re. 32,931 | 5/1989 | Staudte | 73/505 |
| 3,682,003 | 9/1972 | Sage et al. | 73/503 |
| 3,761,829 | 9/1973 | Spaulding | 329/361 X |
| 3,974,699 | 9/1976 | Morris et al. | 73/432 |
| 4,654,663 | 3/1987 | Alsenz et al. | 340/870 |
| 4,899,587 | 2/1990 | Staudte | 73/505 |
| 5,049,830 | 9/1991 | Yoshida | 329/346 X |
| 5,056,366 | 10/1991 | Fersht et al. | 73/505 |
| 5,113,142 | 5/1992 | Yoshikawa | 329/306 |
| 5,173,663 | 12/1992 | Ichiyoshi | 329/346 X |
| 5,193,391 | 3/1993 | Cage | 73/505 |

OTHER PUBLICATIONS

Chi-Tsong Chen, *One-Dimensional Digital Signal Processing*, Marcel Dekker, Inc., New York, N.Y. (1979), pp. 206-215.
Rabiner and Gold, *Theory and Application of Digital Signal Processing*, Prentice-Hall, Inc., Englewood Cliffs, N.J. (1975) pp. 136-140, 194-204.

*Primary Examiner*—David Mis
*Attorney, Agent, or Firm*—H. Fredrick Hamann; George A. Montanye; Tom Streeter

[57] ABSTRACT

To demonstrate a signal, the signal is sampled and each sample of the signal is multiplied by the sine and the cosine of a phase angle indicating when the sample was taken from the signal. The sinusoidal signal for producing an in-phase demodulated signal is Chebychev-approximation derived and computed as a selected even or odd polynomial, depending on whether the phase angle falls within one of a plurality of angular ranges. So that the error in the synthetic sinusoid is minimax and so that the even and odd polynomials have similar computational complexity, the angular ranges for the even polynomial exceed the angular ranges for the odd polynomial. Preferably, the sinusoid for producing a quadrature-phase demodulated signal is computed as a differential of the sinusoid spliced from the odd and even polynomials. Therefore the quadrature-phase demodulated signal can be provided with a minimal increase in computational complexity. The demodulation method permits a signal to be demodulated by a reference frequency signal to produce a demodulated digital signal that is synchronized to a system clock. The system clock need not be synchronized to the reference frequency signal. The demodulation method is computationally efficient, and permits a digital signal processor to be programmed for demodulating an angular rate signal from a quartz angular rate sensor vibrating at about 10 kilohertz.

28 Claims, 22 Drawing Sheets

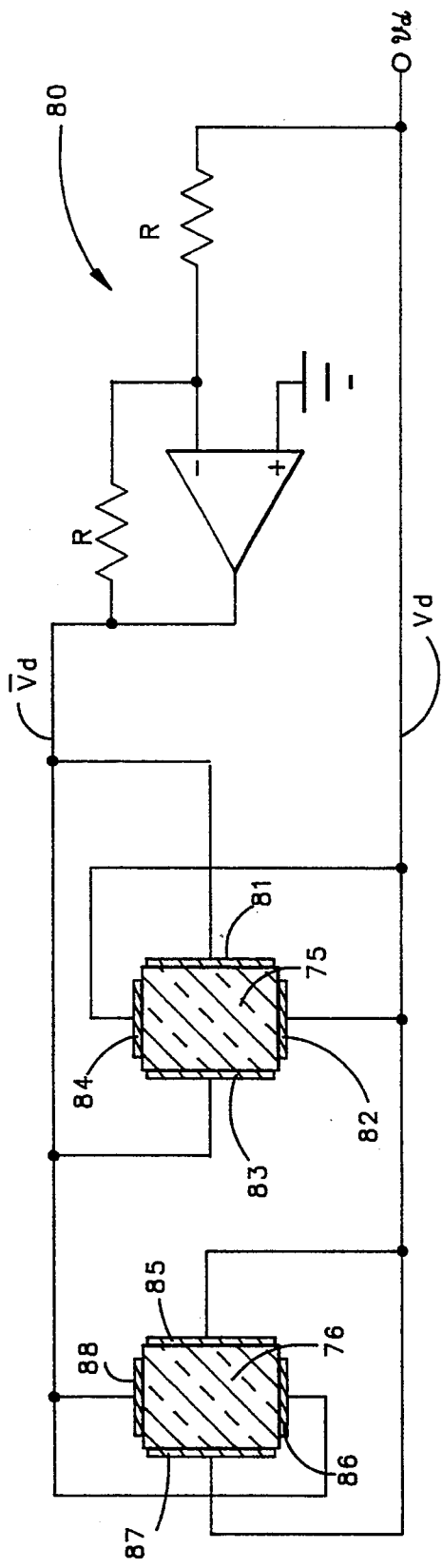
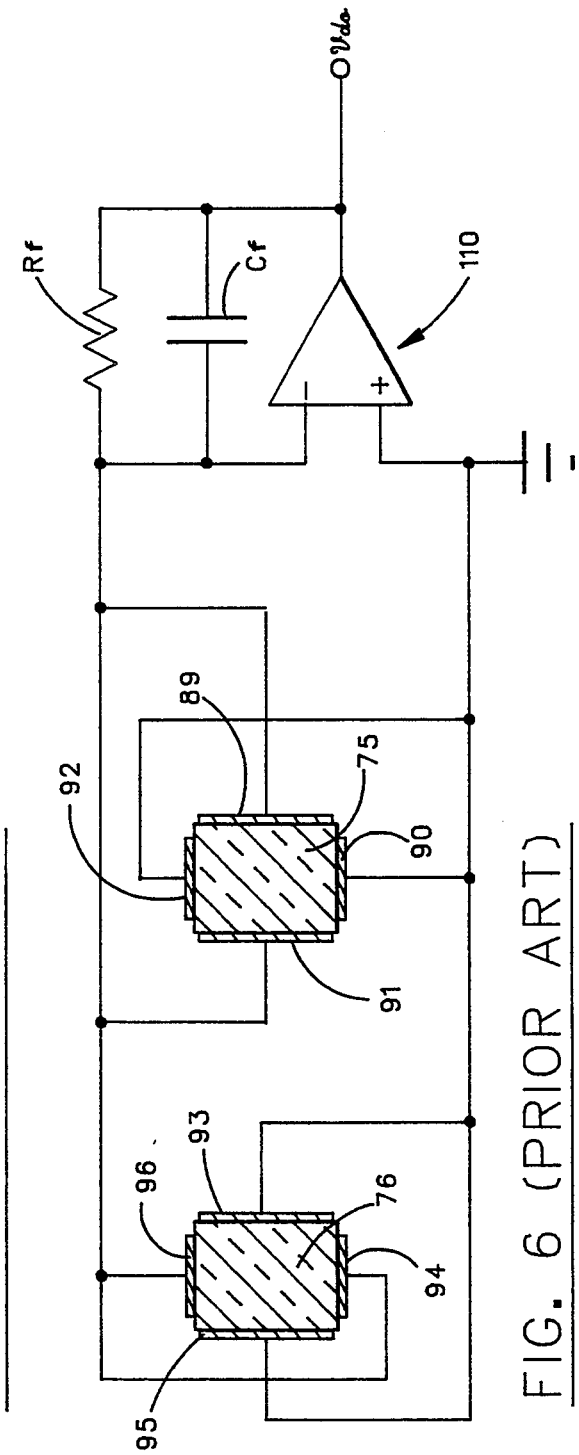
FIG. 5 (PRIOR ART)
FIG. 6 (PRIOR ART)

COMPLEX DIGITAL DEMODULATOR EMPLOYING CHEBYCHEV-APPROXIMATION DERIVED SYNTHETIC SINUSOID GENERATION

BACKGROUND OF THE INVENTION

1. Field of the Invention

The present invention relates generally to digital signal processing, and more particularly to signal processing for a quartz angular-rate sensor or solid-state gyroscope.

2. Background Art

Angular-rate sensors are essential components of navigational and inertial guidance systems of aircraft, spacecraft, ships, and missiles. Traditionally, mechanical gyroscopes were used for angular rate sensing. More recently, laser ring gyros and vibrating quartz gyros have been developed that have characteristics superior to mechanical gyroscopes.

A particularly economical vibrating quartz gyro is made by acid etching of a quartz wafer and has two pairs of parallel tines in an "H" configuration. Such a quartz gyro is described, for example, in Fersht et al. U.S. Pat. No. 5,056,366 and Staudte U.S. Pat. No. 32,931. One pair of tines (the drive tines) is driven by an oscillator so that the tines move toward each other and away from each other. Rotational motion of the tines about the central longitudinal axis of the "H" causes the vibration of the drive tines to couple, by coriolis force, to the other pair of tines (the pick-off tines). The coriolis force causes the pick-off tines to vibrate in such a way that when one pick-off tine moves in one traverse direction perpendicular to the plane of the "H", the other pick-off tine moves in the opposite transverse direction perpendicular to the plane of the "H". The force, which drives the pick-off tines, is proportional to the cross-product of the angular rate of rotation $\Omega$ (e.g., radians per second), and the linear velocity of the drive tines (e.g., meters per second). Metal film pads are plated onto the tines for piezoelectric coupling to these vibrations of the tines. In the electrical pick-off signal, the angular rate of rotation of the quartz gyro about the longitudinal axis appears as double-sideband suppressed-carrier (DSSC) modulation of input angular rate; the carrier frequency is the frequency of oscillation of the drive tines. Therefore, an angular-rate signal can be recovered from the pick-off signal by a synchronous demodulator.

Analog circuits have been used for exciting the quartz gyro and for synchronous demodulation of the pick-off signal. Analog circuits, however, are subject to voltage offsets and drift of component values due to temperature variations and aging. These problems are particularly troublesome due to peculiarities of the quartz gyro that are not apparent from the simplified or "first order" operating characteristics as described above. One problem is related to the resonant frequencies of the drive tines and the pick-off tines. It is undesirable for the pick-off tines to have the same resonant frequency as the drive tines because of the extreme difficulty of removing the dynamics of the pick-off tines from the pick-off signal. If the pick-off tines did have the same resonant frequency as the drive tines, then a maximum amplitude response would be obtained from the pick-off tines, but the angular-rate signal would be a very non-linear function of the angular rate. The resonant frequency of the pick-off tines, however, must be tuned relatively closely to the resonant frequency of the drive tines, or else the dynamic range of the angular-rate signal is limited by noise. Therefore, some resonant frequency offset is required between the drive tines and the pick-off tines. This compromise in resonant frequency offset is to an extent dependent on the bandwidth of the angular-rate signal. In particular, the pick-off tines have a two-pole resonance characteristic, giving a second-order response ($\approx 1/(\omega^2 - \omega_o^2)$) far away from the resonant frequency ($\omega_o$). In practice, these considerations dictate that the difference between the resonant frequency of the drive tines and the resonant frequency of the pick-off tines should be about twice the bandwidth of the angular rate to be sensed by the quartz gyro. A typical quartz gyro for inertial navigation applications, for example, has a drive resonant frequency of about 10 kilohertz, a Q of about 18,000, and a difference of about 100 Hz between the drive resonant frequency and the pick-off resonant frequency. The pick-up tines, for example, have the higher resonant frequency. This difference in resonant frequencies causes the amplitude of the angular-rate signal to be dependent on the frequency as well as the amplitude of vibration of the drive tines. Moreover, the temperature dependence of the difference between the drive and pick-off resonant frequencies is the most critical temperature dependent parameter of the quartz gyro.

To obtain sufficient performance for inertial navigation, the analog circuits associated with the quartz gyro have been relatively complex and expensive. Moreover, it is estimated that the limitations of the prior-art analog circuitry causes the performance of the quartz gyro to be about an order of magnitude less than that theoretically possible and attainable by sufficiently complex digital signal processing.

SUMMARY OF THE INVENTION

In accordance with a basic aspect of the invention, there is provided a method of demodulating a digital signal by a reference frequency signal. The digital signal includes a series of digital values. The reference frequency signal includes a series of phase angle values, and each of the digital values has a corresponding one of the phase angle values. The phase angle value, for example, represents phase at the time that the digital value was generated by sampling an analog signal. The basic method of the invention includes the steps of: computing a numerical approximation of a sinusoidal function of each phase angle value; multiplying each digital sample by the numerical approximation of the sinusoidal function of the phase angle corresponding to said each digital value, to produce a series of products of the sinusoidal function; and digitally filtering the series of products. Preferably the numerical approximation is a Chebychev-derived approximation.

In a specific embodiment of the basic method, the numerical approximation of the sinusoidal function is computed by comparing the phase angle to predefined angular limits, transforming the phase angle by a linear transformation to produce a transformed phase angle in response to the comparing of the phase angle to the predefined angular limits, and computing the numerical approximation of the sinusoidal function as either an even function or an odd function of the transformed phase angle in response to the comparing of the phase angle to the predefined angular limits. The even function is a polynomial of the transformed phase angle, the odd function is also a polynomial of the transformed phase angle, and the even function is used for the numerical approximation of the sinusoidal function over a greater angular range of the phase angle than the odd function. Such a method of approximation is computationally efficient and distributes error evenly over the total angular range.

In accordance with another aspect, the present invention provides a method of demodulating an analog signal by a reference frequency signal to produce a demodulated signal. The method includes the steps of: sampling the analog signal to produce a digital sample; determining a phase angle of the reference frequency signal existing when the analog signal is sampled to produce the digital sample; computing a numerical approximation of a sinusoidal function of the phase angle; and multiplying the digital sample by the numerical approximation of the sinusoidal function of the phase angle, to produce a product that is a sample of the demodulated signal. This method has the advantage of producing a demodulated signal that is digitized asynchronously with respect to the reference frequency signal, because the phase angle is determined with respect to the time of sampling of the analog signal. For computational efficiency, a polynomial approximation is preferably used in determining the phase angle.

In accordance with yet another aspect, the present invention provides a method of demodulating a digital signal including the steps of: computing a numerical approximation of a pair of sinusoidal functions of each phase angle value, the pair of sinusoidal functions being in phase quadrature with each other: and multiplying each digital value by the numerical approximation of each sinusoidal function of the phase angle corresponding to the digital value to produce a series of products of each of the sinusoidal functions. Therefore the method may produce both "in-phase" and "quadrature-phase" products. The quadrature-phase products can be obtained by a small increase in computational complexity, because the approximation of the sinusoidal function used in producing the quadrature-phase products can be computed as a differential of the approximation of the sinusoidal function used in producing the in-phase products.

In a preferred embodiment, the numerical approximation of the in-phase sinusoidal function is delayed by one interval between the digital values before being multiplied by the digital value corresponding to the phase angle, and the numerical approximation of the in-phase sinusoidal function is further delayed by another interval between the digital values so that the differential is computed as the difference in the numerical approximation of the in-phase sinusoidal function over two intervals between the digital values.

In accordance with a final aspect, the present invention provides a system for demodulating an analog signal by a reference frequency signal, and producing a digitized demodulated signal synchronized to a high-speed system clock which is common to a number of instruments. The system includes an analog-to-digital converter for producing digital samples of the analog signal at a predetermined sampling frequency synchronized to the system clock. The system also includes a counter clocked by the system clock for counting during at least one cycle of the system clock. Means including a set of latches are connected to the counter and responsive to the reference frequency signal for determining a number of counts of the counter in a period of the reference frequency signal, and determining a number of counts into a period of the reference frequency signal when the analog signal is sampled by the analog-to-digital converter. The system further includes means for computing a phase angle value for each of the digital samples from the number of counts of the counter in a period of the reference frequency signal, and the number of counts into a period of the reference frequency signal when the analog signal is sampled by the analog-to-digital converter. The system further includes a complex demodulator. The complex demodulator includes means for computing a numerical approximation of a pair of sinusoidal functions of each phase angle value, the pair of sinusoidal functions being in phase quadrature with each other; and means for multiplying the numerical approximation of each sinusoidal function of each phase angle by the digital sample corresponding to the phase angle to produce a series of products of each of the sinusoidal functions. Moreover, the system includes a first digital filter for digitally filtering the series of products of a first one of the sinusoidal functions, and a second digital filter for digitally filtering the series of products of a second one of the sinusoidal functions.

BRIEF DESCRIPTION OF THE DRAWINGS

Other objects and advantages of the present invention will become apparent upon reading the following detailed description and upon reference to the drawings, in which:

FIG. 5 is a cross-section of drive tines of the quartz angular-rate sensor of FIG. 4 along section line 5—5 in FIG. 4;

FIG. 6 is a cross-section of the drive tines of the quartz angular-rate sensor of FIG. 4 along section line 6—6 if FIG. 4;

While the invention will be described in connection with certain preferred embodiments, it is not intended that the invention should be limited to these particular embodiments. On the contrary, the invention is intended to include all modifications, alternatives, and equivalent arrangements as may be included within the scope of this invention as defined by the appended claims.

DETAILED DESCRIPTION OF THE PREFERRED EMBODIMENTS

Figure 1:
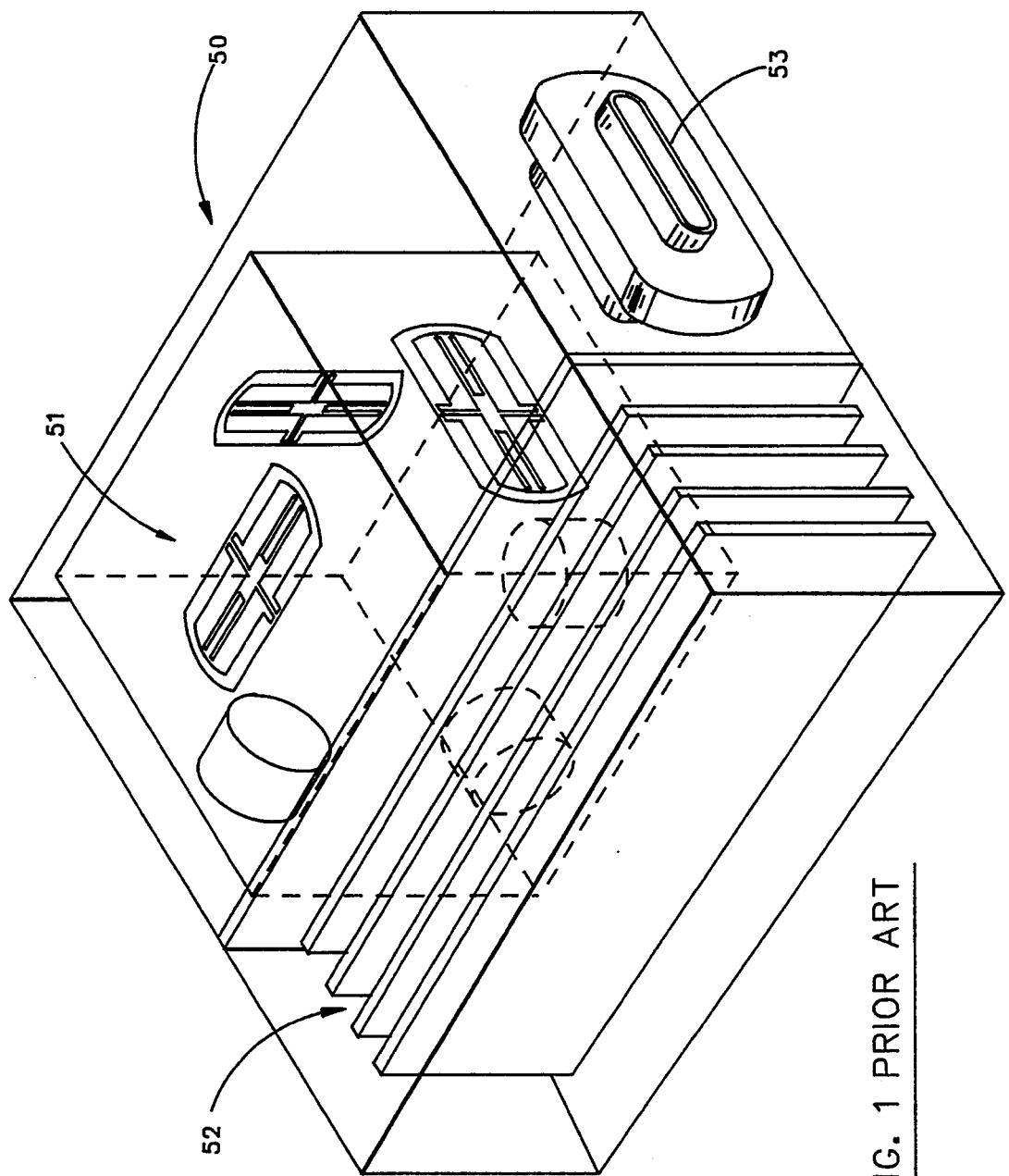
FIG. 1 is a perspective view of an inertial measurement unit incorporating the present invention.

Turning now to the drawings, there is shown in FIG. 1 a schematic perspective view of an inertial measurement unit generally designated 50 incorporating the present invention. The inertial measurement unit includes a block of sensors 51, electronic circuit boards 52, and an electrical connector 53. The inertial measurement unit 50 provides an angular velocity signal and a linear acceleration signal with respect to each of three orthogonal directions. The angular velocity and linear acceleration signals have a 50 Hz bandwidth.

Figure 2:
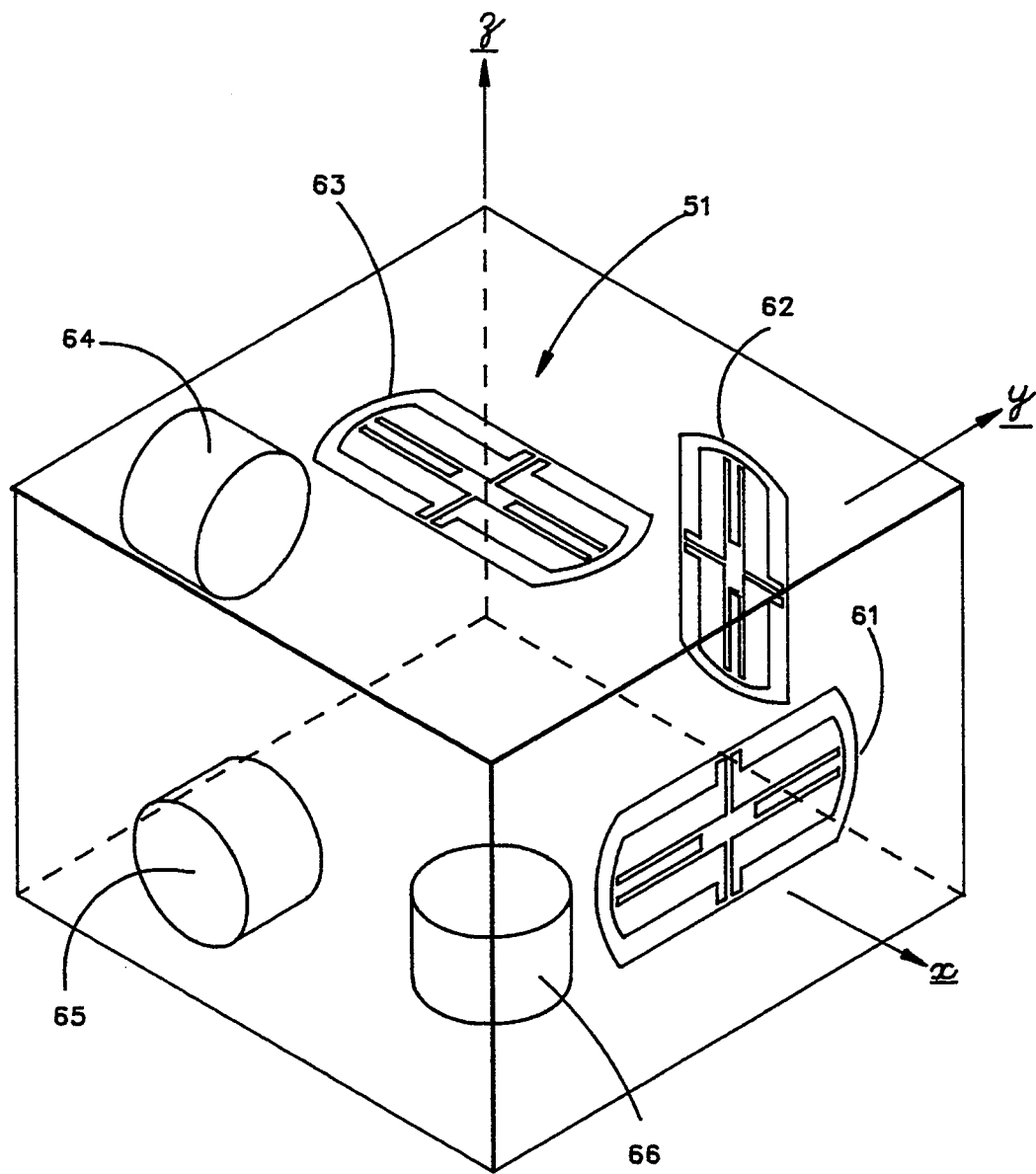
FIG. 2 is a pictorial view of a mounting arrangement for accelerometers and quartz angular-rate sensors used in the inertial measurement unit of FIG. 1.

Turning now to FIG. 2, there is shown a pictorial view of the sensor block 51. The block is made of a rigid material such as aluminum or polycarbonate. A quartz angular-rate sensor or a vibrating quartz accelerometer is mounted into each of the six faces of the block 51. The sensors include quartz angular-rate sensors 61, 62, and 63 mounted on the faces facing the +x, +y, and +z directions. The sensors include vibrating quartz accelerometers 64, 65, and 66 mounted on the faces facing the −x, −y, and −z directions, respectively.

The present invention concerns signal processing for the quartz angular-rate sensors 61, 62, and 63. The quartz angular-rate sensors operate entirely independent of the vibrating quartz accelerometers. Therefore, the vibrating quartz accelerometers 64, 65, 66 are not pertinent to the present invention and will not be described in any further detail.

Figure 3:
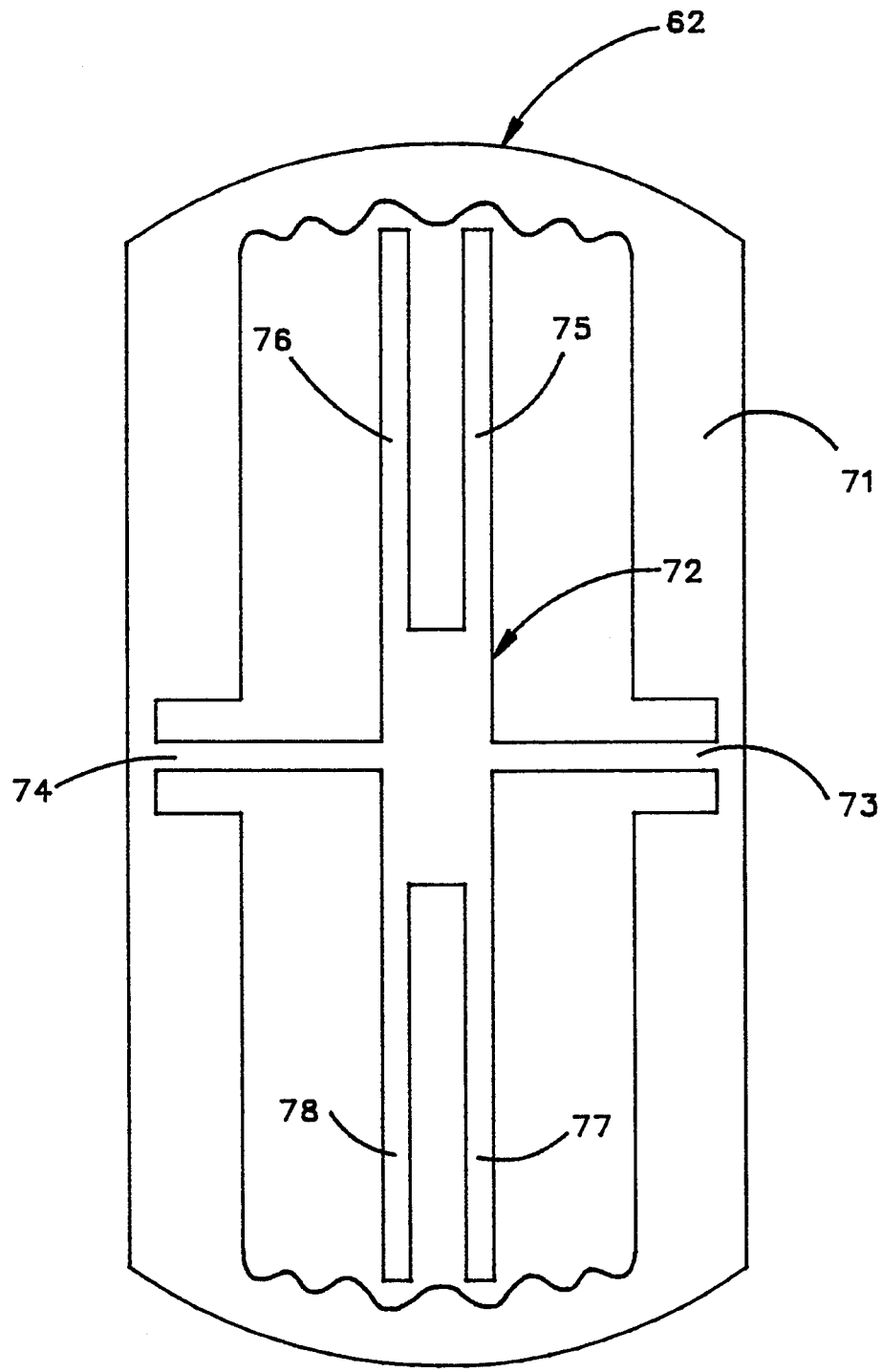
FIG. 3 is a plan view of one of the quartz angular-rate sensors of FIG. 2.

Turning now to FIG. 3, there is shown a more detailed view of the quartz angular-rate sensor 62. The sensor 62 is fabricated from a z-cut quartz wafer using conventional photolithographic and acid etch batch processes, and can be purchased from Systron Donner Corporation of Concord, Calif. The sensor has a frame 71 attached to an "H"-shaped section by a pair of bridges 73, 74. The "H"-shaped section 72 has a pair of drive tines 75, 76, and a pair of pick-up tines 77, 78.

Figure 4:
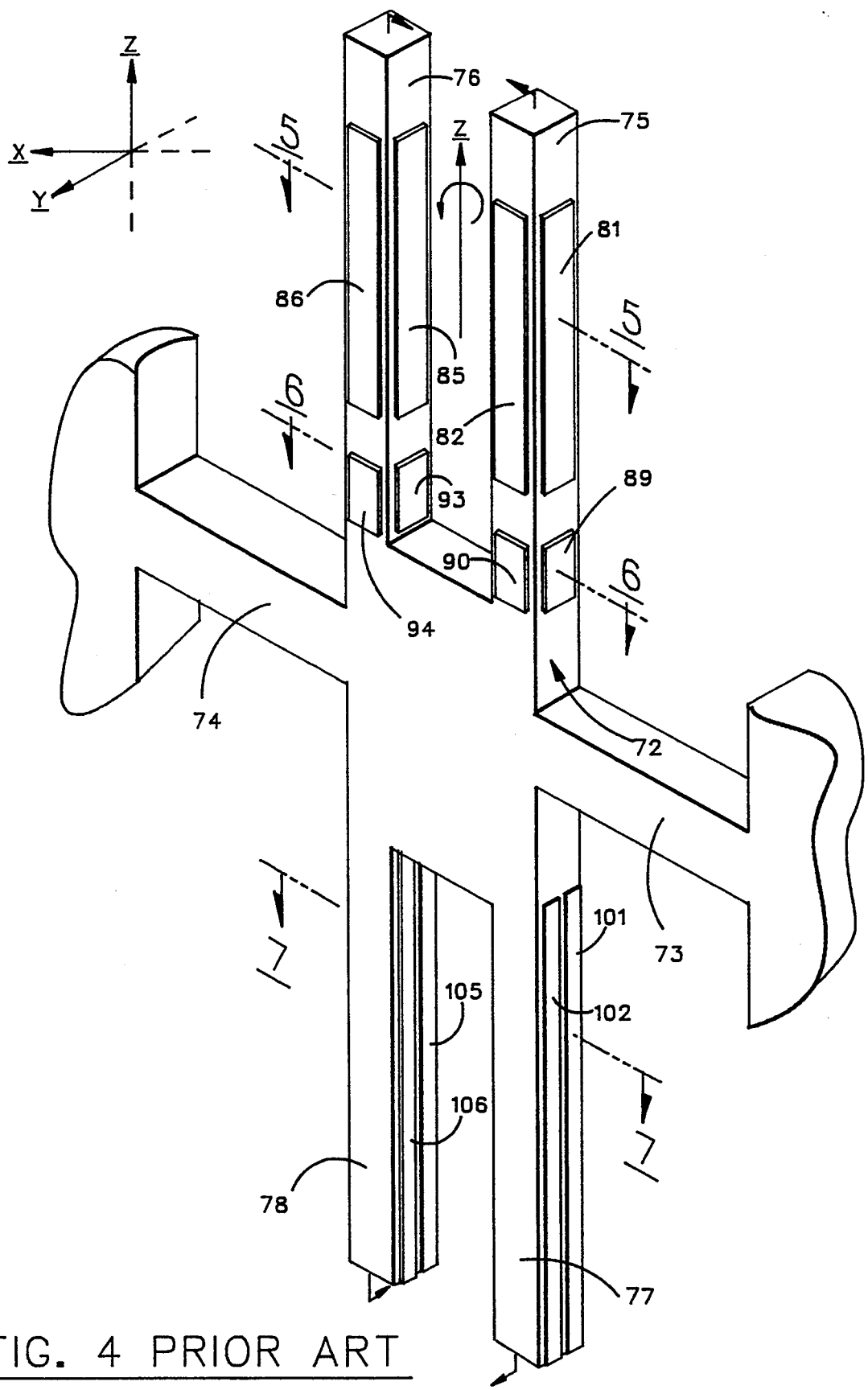
FIG. 4 is a perspective view of a central portion of the quartz angular-rate sensor of FIG. 3.

Turning now to FIG. 4, there is shown a number of metal film electrodes deposited on the tines 75, 76, 77, and 78. The drive tines 75, 76 are provided with drive electrodes 81, 82, 83, 84, 85, 86, 87, 88, as further shown in FIG. 5. The drive electrodes are driven by a complementary drive signal $V_d$, as shown in FIG. 5, to excite a mode of vibration in the drive tines 75, 76 in which the drive tines first move toward each other in the x direction, as shown in FIG. 4, and then away from each other, during each cycle of vibration. To sustain such a mode of vibration, the complementary drive signal $V_d$ must be tuned to the resonant frequency of the drive tines. As shown in FIG. 5, a unity-gain inverting amplifier 80 is used in providing the complementary drive signal from a single-ended drive signal.

To drive the drive tines 75, 76 at their resonant frequency, the drive tines are excited in response to sensing their elastic deformation. For this purpose, a second set of metal film electrodes 89 to 96, as further shown in FIG. 6, are disposed on the drive tines 75, 76 at locations of maximum elastic deformation where the tines are joined to the central portion of the H-shaped structure 72, as shown in FIG. 4. These electrodes 89 to 96 are connected to a conventional amplifier 110 providing a signal $v_{do}$ indicating the elastic deformation of the drive tines 75, 76.

As shown in FIG. 4, the vibration of the pick-up tines 77, 78 is sensed by metal film electrodes 101 to 108 deposited on the pick-up tines. As further shown in FIG. 7, the pick-up electrodes 101 to 108 are connected to a conventional amplifier 111 to provide a signal $v_r$ indicating the vibration of the pick-up tines.

Figure 7:
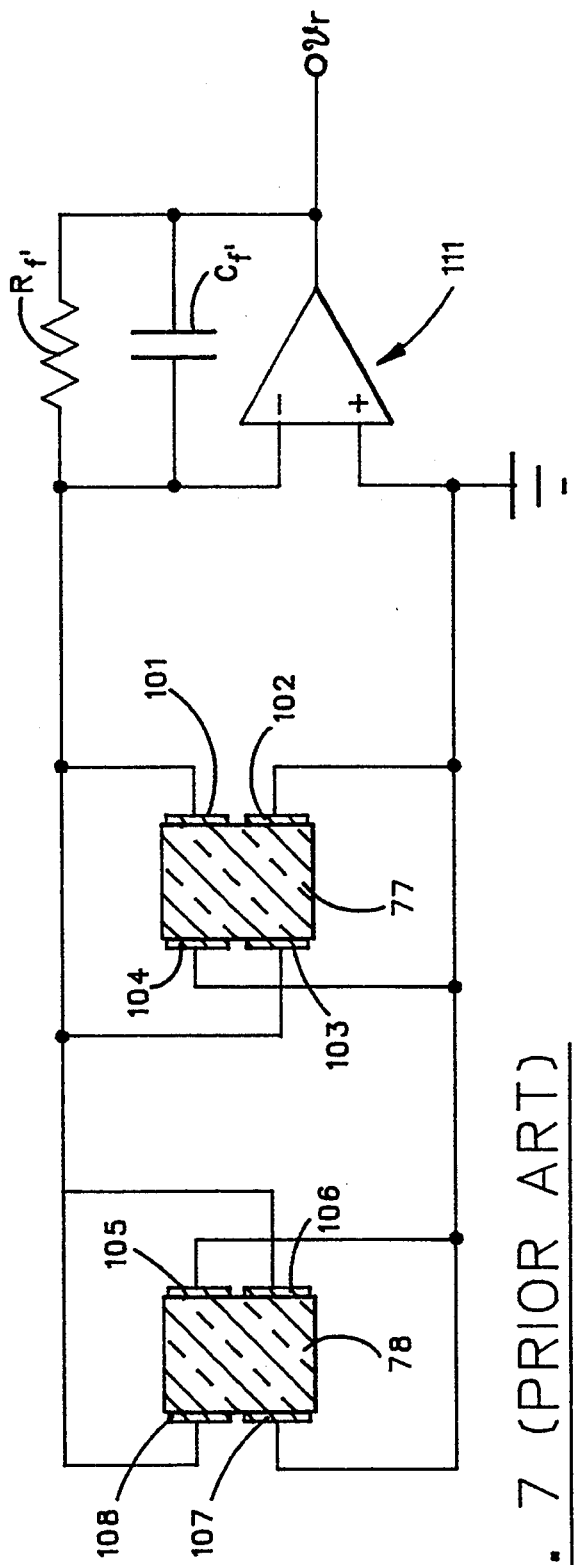
FIG. 7 is a cross-section of pick-up tines of the quartz angular-rate sensor of FIG. 4 along section line 7—7 in FIG. 4.
Figure 8:
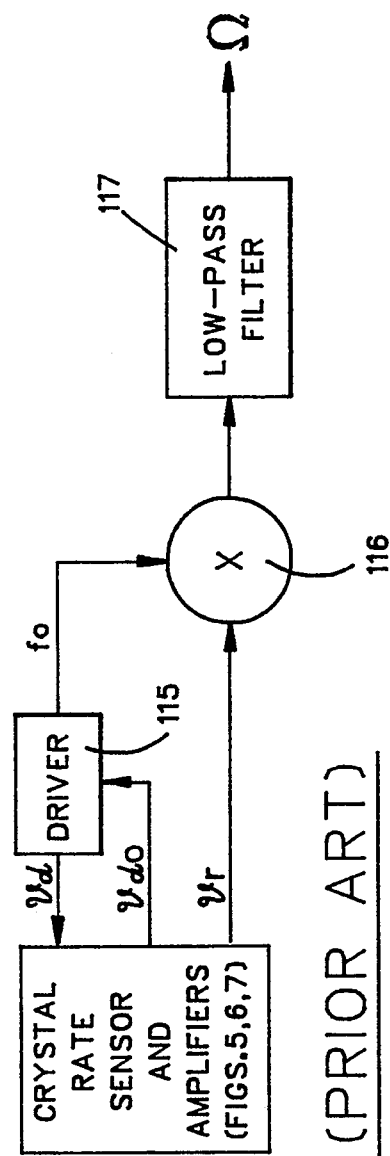
FIG. 8 is a block diagram of a conventional system for exciting the crystal rate sensor of FIG. 4 and synchronously detecting an angular-rate signal.

Turning now to FIG. 8, there is shown a conventional circuit for obtaining an angular-rate signal $\Omega$ from the crystal rate sensor and amplifiers as shown in FIGS. 5, 6, and 7. A driver circuit 115 is responsive to the signal $v_{do}$ to produce a drive signal $v_d$ at the resonant frequency of oscillation of the drive tines (75, 76 in FIG. 4). Moreover, the driver circuit 115 insures that the amplitude of vibration of the drive tines 75, 76 is substantially constant. Further, the driver 115 supplies a signal at the frequency of oscillation $f_o$ to a synchronous detector 116, such as a balanced modulator, that modulates the pick-up signal $v_r$ to detect the angular-rate information. A low-pass filter 117 extracts the angular-rate signal $\Omega$ from the output of the synchronous detector 116.

Figure 9:
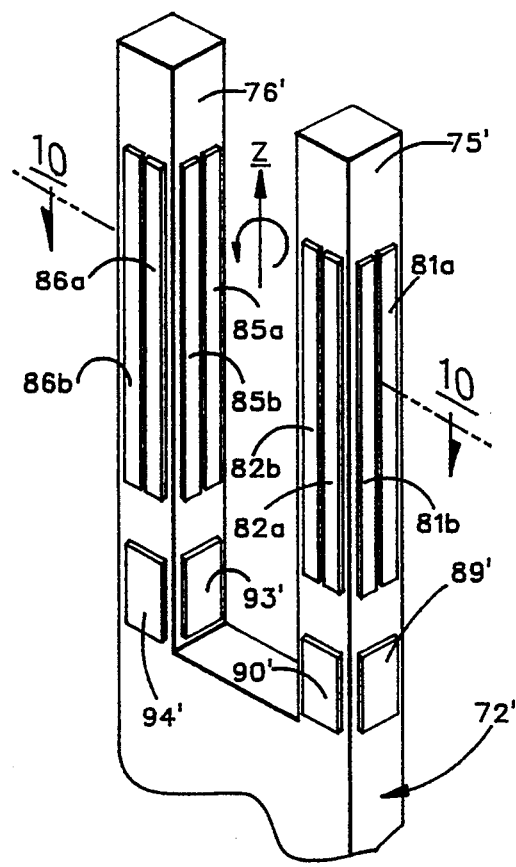
FIG. 9 is a perspective view showing an alternative construction for electrodes on drive tines of a quartz angular-rate sensor.
Figure 10:
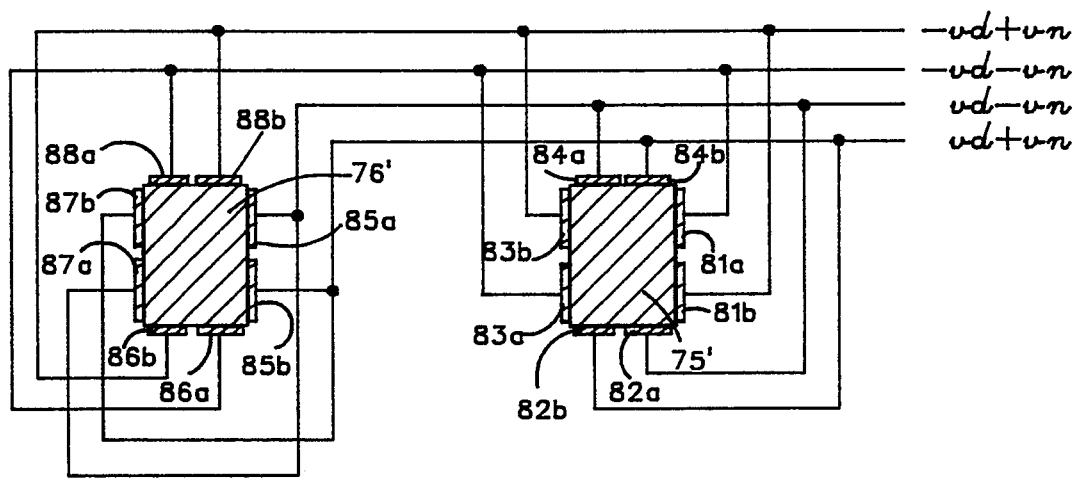
FIG. 10 is a cross-section of the drive tines of the quartz angular-rate sensor of FIG. 9 along section line 10—10 of FIG. 9.

Turning now to FIG. 9, there is shown an alternative construction in which pairs of drive electrodes 81a, 81b, to 88a, 88b, are deposited on the drive tines 75', 76', as further shown in FIG. 10. In this alternative construction, the drive electrodes 81a, 81b, to 88a, 88b are excited with a nulling signal $v_n$ in addition to the drive signal $v_d$. The nulling signal $v_n$ excites vibrations of the drive tines 75', 76' that directly couple to the pick-up tines (not shown), and therefore the nulling signal can be adjusted to minimize or null the vibration of the pick-up tines 77, 78.

Figure 11:
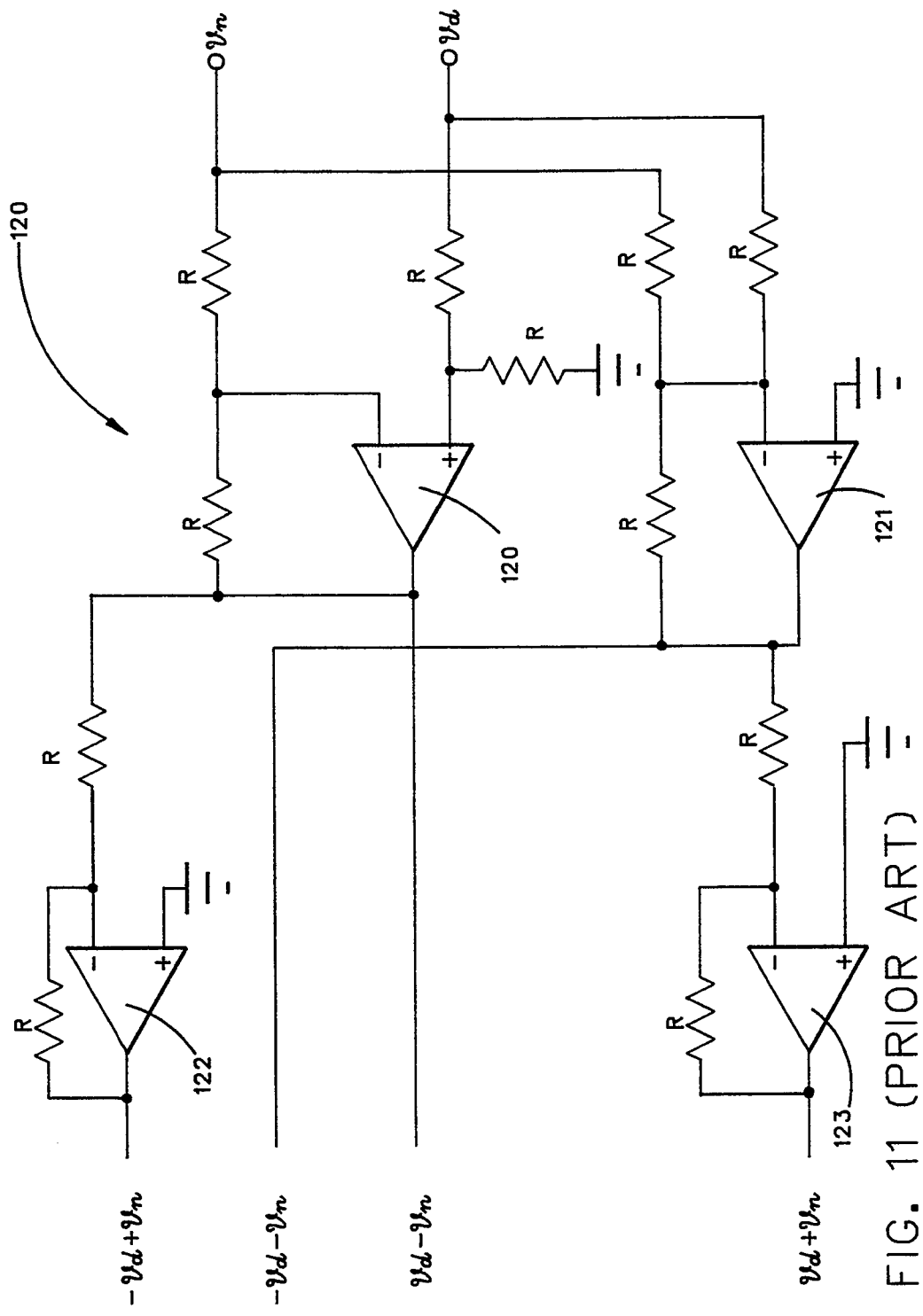
FIG. 11 is a schematic diagram of analog computational circuits for computing drive signals for the drive electrodes as shown in FIG. 10.

As shown in FIG. 11, analog computational circuits 120 receive a single-ended drive signal $v_d$ and a single-ended null signal $v_n$ to produce electrical signals $(-v_d+v_n, -v_d-v_n, v_d-v_n, -v_d-v_n)$ that are applied to the pairs of drive electrodes (81a, 81b, to 88a, 88b in FIG. 10). These analog computational circuits 120 include an operational amplifier 120 wired as a differential amplifier, an operational amplifier 121 wired as an inverting summing amplifier, an operational amplifier 122 wired as an inverting unity gain amplifier, and an operational amplifier 123 wired as an inverting unity gain amplifier.

Figure 12:
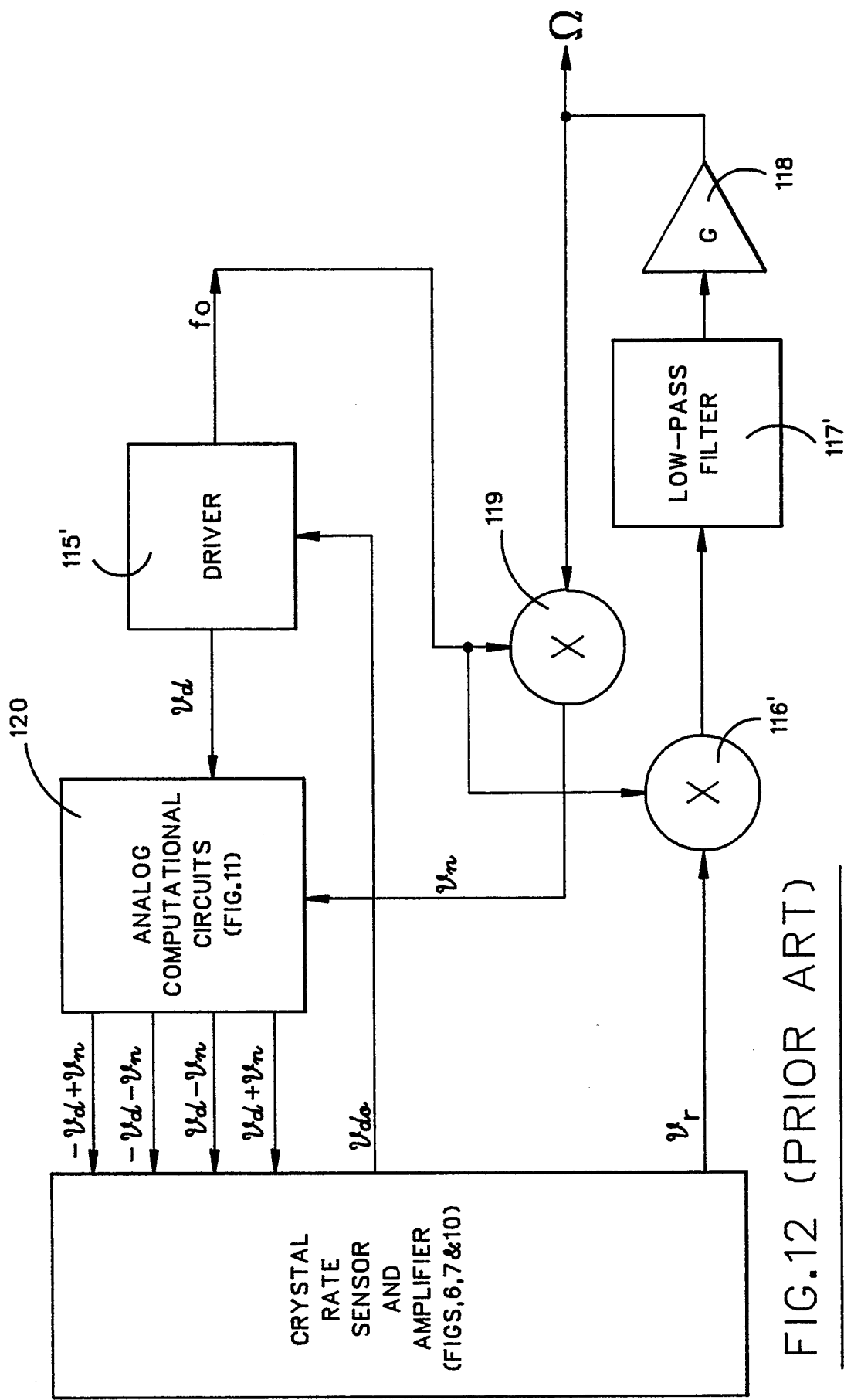
FIG. 12 is a conventional circuit for exciting the crystal rate sensor of FIG. 9 and synchronously detecting an angular-rate signal.

When the crystal rate sensor is operated such that a null signal $v_n$ nulls out the pick-up signal $v_r$, the crystal rate sensor is said to be operated in a "closed loop" mode. A circuit for operating the crystal rate sensor in such a "closed-loop" mode is shown in FIG. 12. The circuit includes a driver 115', a synchronous detector 116', and a low-pass filter 117' that are similar to the driver 115, synchronous detector 116, and low-pass filter 117 introduced in FIG. 8. However, the circuit in FIG. 12 further includes a baseband servo equalizer and feedback amplifier 118, a balanced modulator 119 for supplying the null signal $v_n$ at the frequency of oscillation $f_o$ but having an amplitude controlled by negative feedback to null out the pick-up signal $v_r$, and the analog computational circuits 120 shown in FIG. 11. Therefore, the amplifier 118 provides the angular-rate signal $\Omega$.

Figure 13:
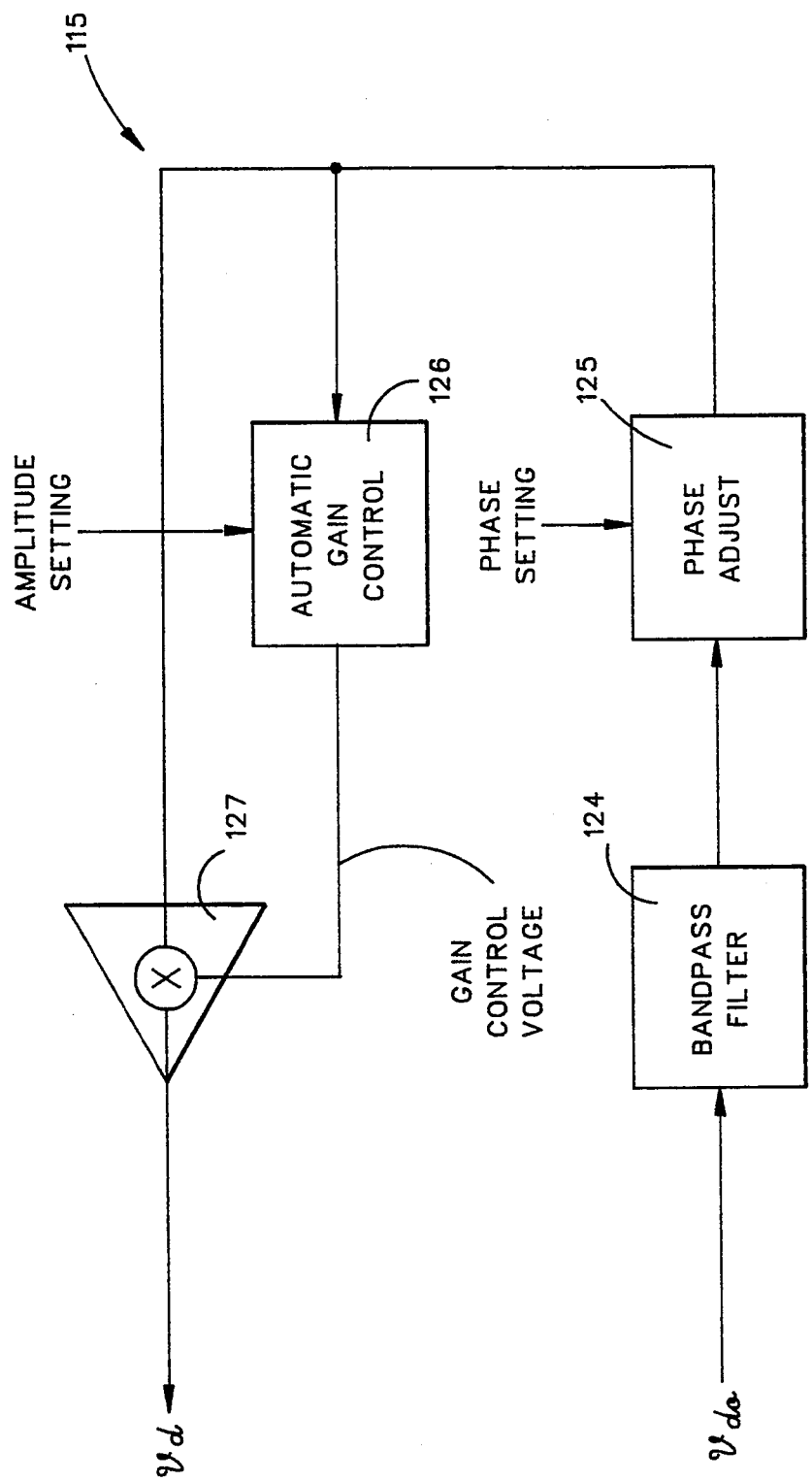
FIG. 13 is a block diagram of an analog drive circuit used, in FIG. 12 for exciting the crystal rate sensor.

Turning now to FIG. 13, there is shown a block diagram for the driver circuit 115 of FIG. 8. The driver circuit 115 includes a bandbass filter 124 that filters the $v_{do}$ signal and is tuned for a maximum response at the resonant frequency $f_o$ of the drive tines. The output of the bandpass filter 124 is fed through a phase-adjusting circuit 125 that is adjusted for (360)(n) degree (n is any integer) phase shift around the entire drive loop, through the drive electrodes (81 to 88 in FIGS. 4 and 5), through the physics of the drive fork, through the drive sensing electrodes (89 to 96 in FIGS. 4. and 6), and through the electronics in FIG. 13. The output of the phase-adjusting circuit is fed to an automatic gain control 126 that senses the amplitude of the signal from the phase-adjusting circuit and generates a gain control voltage responsive to the difference between the amplitude of the signal from the phase-adjusting circuit 125 and an amplitude setting. The amplitude setting may be adjusted, for example, in response to calibrating the angular-rate sensor by subjecting the sensor to a precise rate of angular rotation and adjusting the amplitude setting so that the angular-rate signal $\Omega$ precisely indicates the rate of angular rotation. The gain-control voltage from the automatic gain control adjusts the gain of a linear amplifier 127 that amplifies the output of the phase-adjusting circuit 125 to produce the drive signal $v_d$. The linear amplifier, for example, is an operational transconductance amplifier, such as RCA part No. CA3080.

Figure 14:
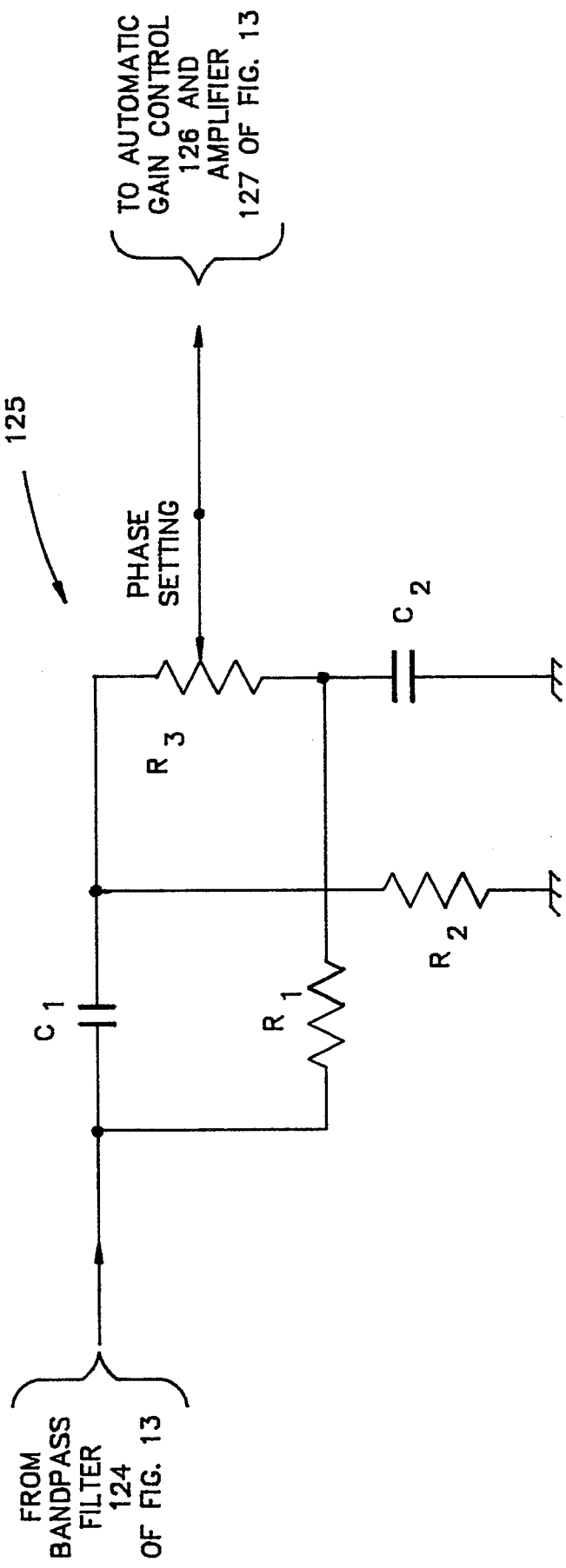
FIG. 14 is a schematic diagram of a phase-adjusting circuit used in FIG. 13.

Turning now to FIG. 14, there is shown a schematic diagram for the phase-adjusting circuit 125. The phase-adjusting circuit is a lead-lag network having resistances $R_1$, $R_2$, $R_3$ and capacitances $C_1$, $C_2$ such that $R_1 = 1/\omega C_1$, $R_2 = 1/\omega C_2$, and $R_3 > R_2 >> R_1$, where $\omega = 2\pi f_o$. The resistance $R_3$ is a potentiometer, which can be adjusted for a phase shift of about $\pm(45°)(R_1/R_2)$.

Figure 15:
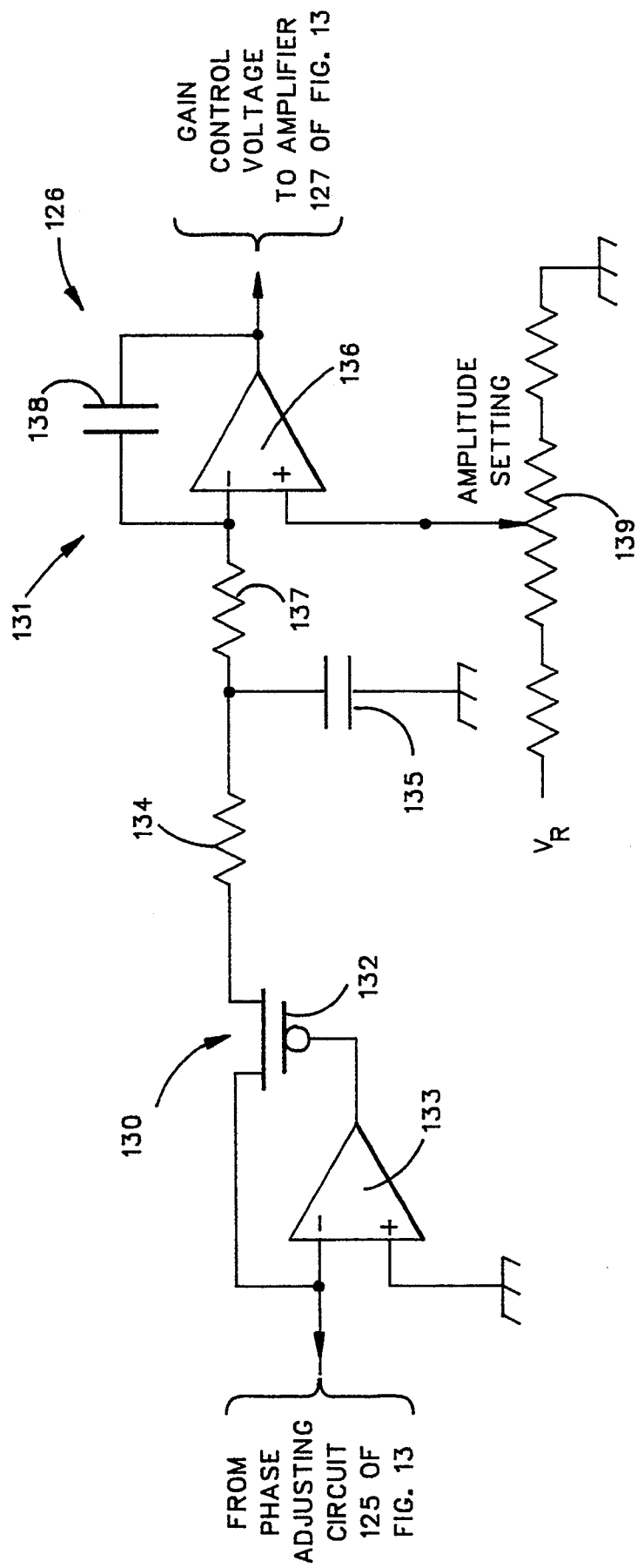
FIG. 15 is a schematic diagram of an automatic gain control circuit used in FIG. 13.

Turning now to FIG. 15, there is shown a schematic diagram for the automatic gain control circuit 126. The automatic gain control circuit includes an amplitude detector 130 and an integrating comparator 131. The amplitude detector 130 has an N-channel MOS-FET 132 that is turned on and off by a voltage comparator 133 responsive to the polarity of the signal from the phase-adjusting circuit 125. Therefore, the N-channel MOS-FET functions as a half-wave rectifier. The rectified signal is low-pass filtered by a series resistor 134 and a shunt capacitor 135, so that the voltage on the capacitor 135 indicates the amplitude of the signal from the phase-adjusting circuit 125. The integrating comparator is an operational amplifier 136 having an input resistor 137 and a feedback capacitor 138 connected to the negative input of the operational amplifier. The positive input of the operational amplifier 136 receives an amplitude setting voltage from a potentiometer 139. The potentiometer 139 is excited by a constant reference voltage $V_R$. The output of the operational amplifier 136 provides the gain control voltage to the amplifier 127 of FIG. 13.

The present invention provides a very precise method of detecting the angular-rate signal $\Omega$. The detection method is so precise that a conventional driver circuit (115 in FIG. 13) can be a source of error in the detected angular-rate signal $\Omega$. Possibly, the manufacturers of the quartz rate sensors will develop more precise driver circuits. Otherwise, it would be desirable to use digital techniques for generating the drive signal $v_d$ to the quartz rate sensor, since digital techniques can provide amplitude and phase stability that is superior to the amplitude and phase stability of analog circuits.

Figure 16:
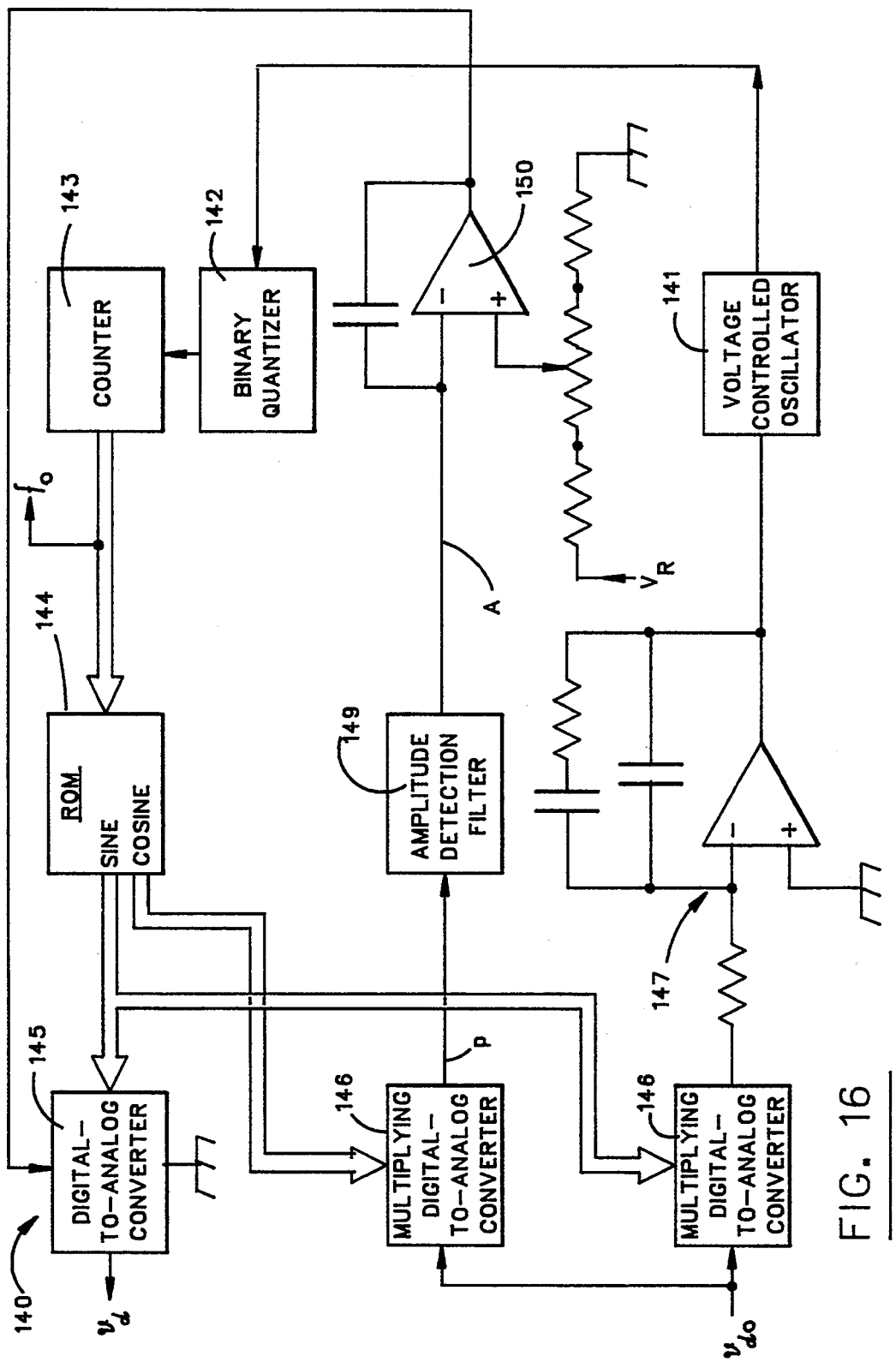
FIG. 16 is a block diagram of a driver circuit using digital techniques for exciting a quartz angular-rate sensor.

Turning now to FIG. 16, there is shown a driver circuit 140 using digital techniques for generating the drive signal $v_d$. The driver 140 has a high-frequency, voltage-controlled oscillator 141 that is phase-locked to the elastic vibrations of the drive tines as indicated by the signal $v_{do}$. The output of the voltage-controlled oscillator 141 is quantized in a binary quantizer 142 such as a Schmitt trigger or limiter such as a string of inverters. The purpose of the binary quantizer 142 is to generate a digital clocking signal suitable for clocking a counter 143. The clocking signal, for example, has one pulse per cycle of the input signal to the binary quantizer 142. The counter 143 divides the frequency of the voltage-controlled oscillator 141 to provide a signal at the frequency of oscillation $f_o$ of the drive tines. The numerical value from the counter 143 represents the phase of oscillation.

In the circuit of FIG. 16, the drive signal $v_d$ is generated by addressing a sine table in a read-only memory (ROM) 144 with the numerical value from the counter 143. The sine value is converted in a digital-to-analog converter 145 to produce the drive signal $v_d$.

To compare the phase of the signal from the VCO 141 to the phase of the elastic vibrations of the drive tines, the sine value from the ROM 144 is applied to a multiplying digital-to-analog converter 146 that receives as its voltage reference the signal $v_{do}$. As is well-known, a multiplying digital-to-analog converter is a digital-to-analog converter that accepts a reference voltage $V_R$ and provides an analog output ranging from $+V_R$ to $-V_R$ so that the analog-to-digital converter may function as a balanced modulator. One conventional form of construction for a multiplying DAC has two analog buffer amplifiers of gain $+1$ and $-1$, respectively, to provide buffered voltage references $+V_R'$ and $-V_R'$; a CMOS analog multiplexer for each input bit selecting either $+V_R'$ or $-V_R'$; and an R/2R ladder connecting the analog output of each analog multiplexer to the output of the multiplying DAC.

The output signal of the multiplying digital-to-analog converter 146 is applied to an integrating filter 147 that provides a phase-error signal to the voltage-controlled oscillator 141. The integrating filter 147 is a conventional lead-lag charge-pump filter that insures that the average phase error of the phase-lock loop is zero. When the phase-lock loop is phase-locked, there will be approximately (360)(n) degrees (n is any integer) of phase shift through the quartz rate sensor from the drive electrodes 81 to 88 in FIG. 5 to the drive sensing electrodes 89 to 96 in FIG. 6. The circuit of FIG. 6 is designed assuming that there is a 90° phase shift through the amplifier 110. In other words, the amplifier 110 functions as a "charge amplifier" or integrator at the frequency $f_o$, because the feedback capacitance $c_f$ is selected to be about 5 to 10 times the product of $2\pi f_o$ and the feedback resistance $R_f$. Preferably, the amplifier 111 in FIG. 7 is also a "charge amplifier" or integrator at the frequency $f_o$.

In order to drive the drive tines to excite elastic vibrations of substantially constant amplitude, the circuit in FIG. 16 has an automatic gain control loop including a multiplying digital-to-analog converter 148, an amplitude detection filter 149, and an integrating voltage comparator 150 that provides the reference voltage for the digital-to-analog converter 145 that drives the drive tines. The multiplying digital-to-analog converter 148 receives the signal $v_{do}$ as its voltage reference, and receives a digital cosine value from the ROM 144. The amplitude detection filter 149 is a low-pass filter having a notch at $2f_o$.

Figure 17:
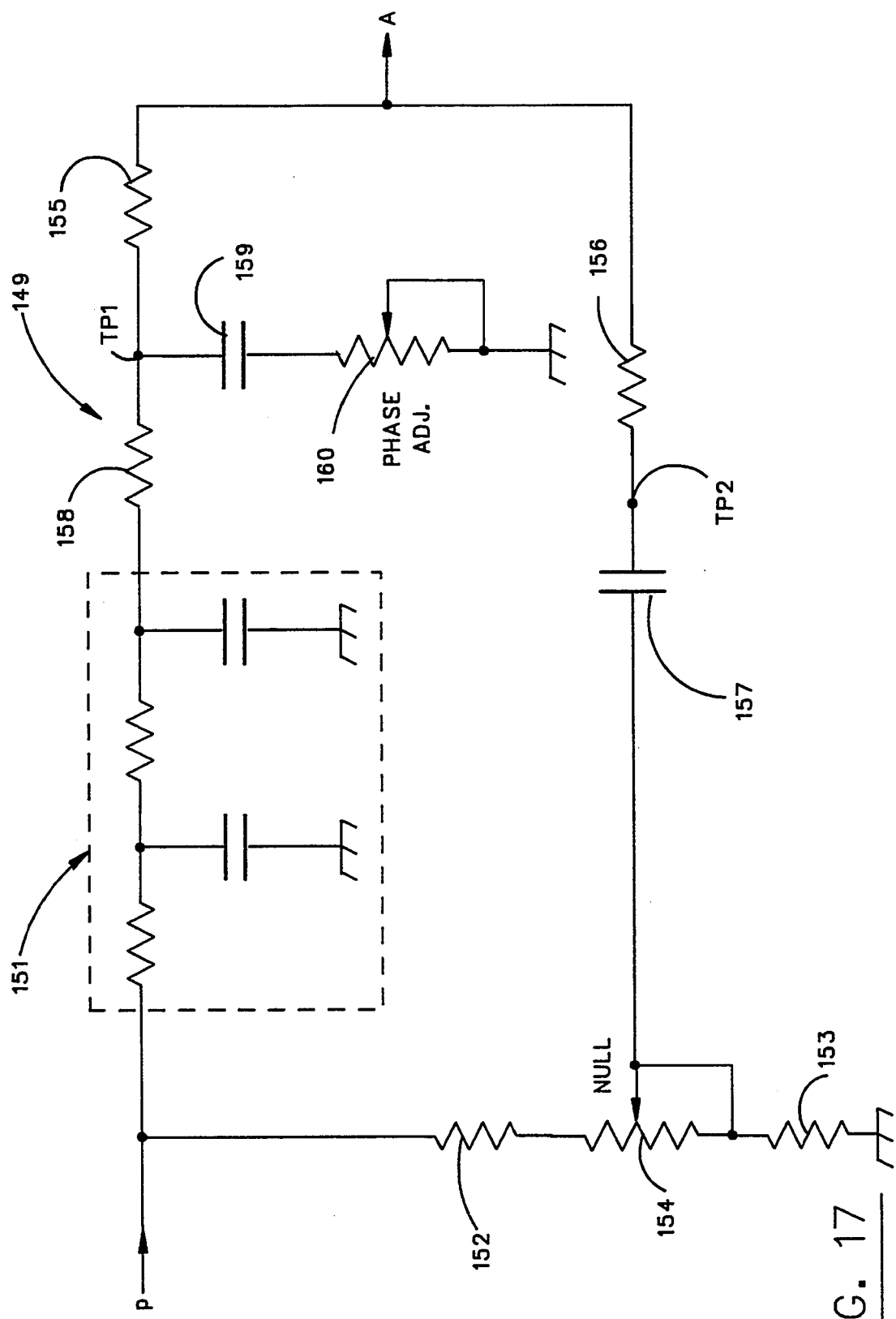
FIG. 17 is a schematic diagram of an amplitude detection filter used in FIG. 16.

Turning now to FIG. 17, there is shown a schematic diagram of the amplitude detection filter 149 of FIG. 16. The amplitude detection filter 149 includes a second-order low-pass filter 151 that provides nearly a 180° phase shift at twice the frequency $f_o$. In order to null out the product at $2f_o$ from the output (p) of the multiplying digital-to-analog converter (148 in FIG. 16), the output (p) is reduced in amplitude by a voltage divider including resistors 152, 153 and a variable resistor 154. A pair of equal-valued summing resistors 155, 156 sum the output of the filter 151 with the output of the voltage divider. A DC blocking capacitor 157 is connected between the variable resistor 154 and the summing resistor 156. To obtain a very deep notch at $2f_o$, a resistor 158, a capacitor 159, and a variable resistor 160 can also be used so that by adjusting the variable resistor 160, the phase of the $2f_o$ signal at a test point TP1 will have a phase shift of precisely 180° with respect to the signal at the test point TP2. Therefore, the variable resistor 154 can be adjusted to cancel the $2f_o$ signal from the amplitude signal A.

Figure 18:
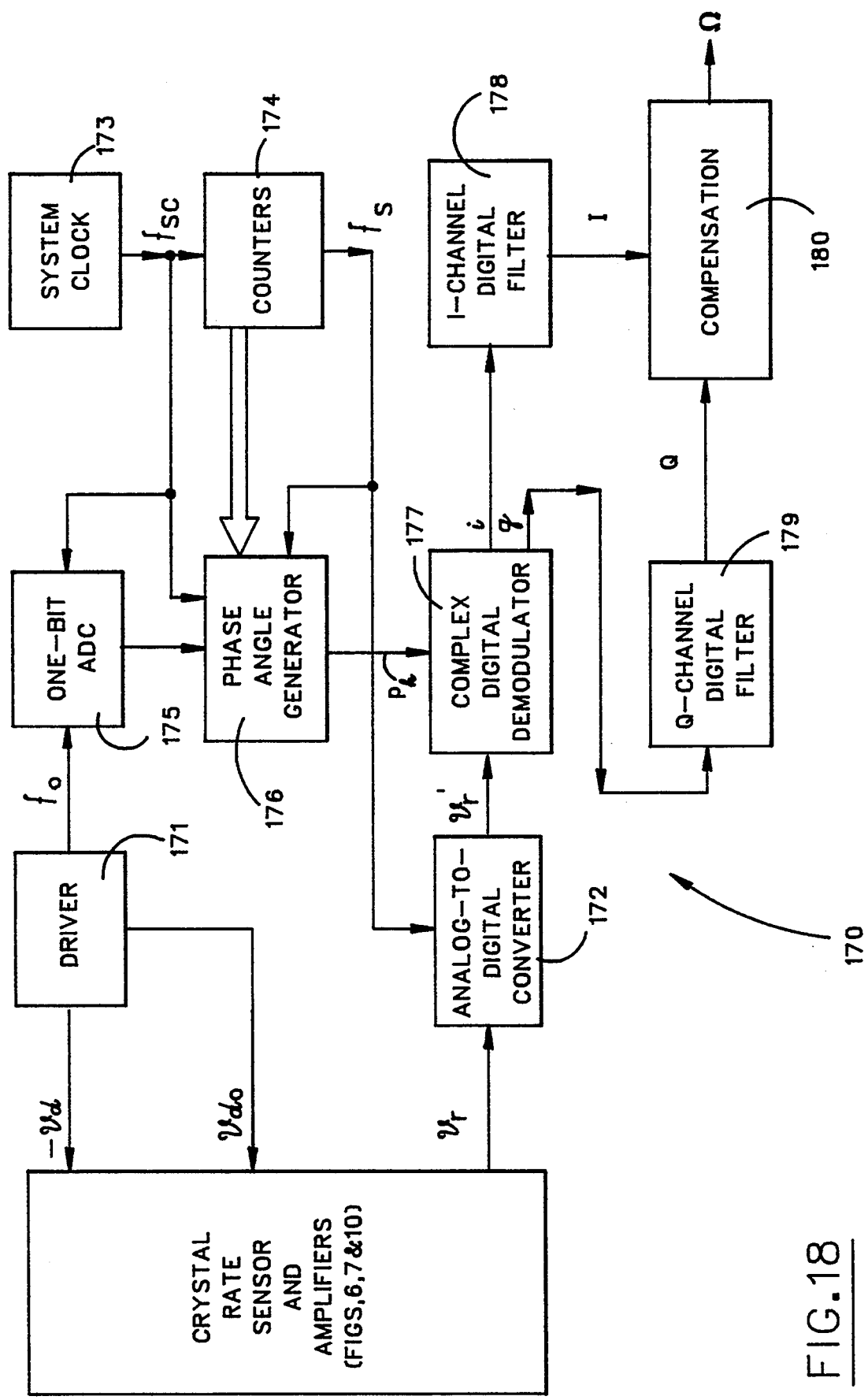
FIG. 18 is a block diagram of an angular rate sensing system employing a complex digital demodulator in accordance with the present invention.

Turning now to FIG. 18, there is shown a block diagram of a system 170 for synchronously detecting the angular rate signal using the method of the present invention. The system 170 in FIG. 18 may use a conventional driver circuit 171 for driving the drive tines of the crystal rate sensor at a frequency oscillation $f_o$.

The pick-off signal $v_r$ from the crystal rate sensor is digitized by an analog-to-digital converter 172, and the angular rate signal is demodulated from the digital output of the analog-to-digital converter 172.

The sampling of the pick-off signal $v_r$ by the analog-to-digital converter 172 is synchronized to a system clock 173. The system clock 173 need not be synchronized to the elastic vibrations of the drive tines, and preferably the system clock 173 is not synchronized to the elastic vibrations of the drive tines. In this case, the digital signal processing for all three of the crystal rate sensors in the inertial measurement unit 50 of FIG. 1 can be performed in synchronism with the single system clock 173.

The system clock 173 could be synchronized to or provided by an inertial navigation system (not shown) which is to receive data from the inertial measurement unit 50 of FIG. 1. Therefore, by synchronizing the analog-to-digital converter 172 to the system clock 173, the angular rate information provided by the system 170 in FIG. 18 can be very easily transferred to the inertial navigation system at a constant rate specified for the inertial navigation system. For the system 170 as shown in FIG. 18, the analog-to-digital converter 172 preferably samples at a rate of 42 KHz, because this rate is compatible with the digital sampling rates of many inertial navigation systems.

In the system of FIG. 18, the system clock 173 operates at a very high rate $f_{sc}$ that is a harmonic of the 42 KHz sampling rate $f_s$. Therefore, the 42 KHz sampling rate $f_s$ can be generated in a set of counters 174 that divides down the high frequency $f_{sc}$ of the sampling clock 173. The system clock 173, for example, operates at 32.256 MHz, which is 768 times the 42 KHz sampling rate $f_s$.

In accordance with an aspect of the present invention, the angular rate information is synchronously detected from the digitized samples of the pick-off signal $v_r$ by computing numerical functions of the phase angle $\rho_k$ of the elastic vibrations of the drive tines at the time that the analog-to-digital converter 172 samples the pick-off signal $v_r$.

To determine the phase angle $\rho_k$, a one-bit analog-to-digital converter 175 synchronizes a signal from the driver 171 to the system clock, to produce a square wave at the frequency of oscillation $f_o$ to the system clock $f_{sc}$, and then a phase angle generator 176 determines a phase angle of a transition in the square wave with reference to counts in the counters 174. The phase angle generator 176 captures particular counter values in a set of latches or registers in order to determine the number of counts in a period of the square wave at the frequency $f_o$, and to capture the number of counts into a period of the square wave $f_o$ when the pick-off signal $v_r$ is sampled by the analog-to-digital converter 172. A normalized phase angle ranging between zero and one is computed by dividing these two numbers, as will be further described below with reference to FIGS. 19 and 20.

In accordance with another aspect of the present invention, a complex digital demodulator 177 receives, at the 42 KHz sampling rate $f_s$, a numerical sampled value of the pick-off signal $v_r$, and demodulates the sampled value to obtain an in-phase value (i) and a quadrature-phase value (q). The in-phase value (i) is obtained by computing a certain approximation for the cosine of the phase angle, and multiplying that approximated value by the sampled value of the pick-off signal $v_r$. The quadrature-phase value (q) is obtained by computing a 90° phase shift to approximate the sine of the phase angle, and multiplying that approximation by the sampled value of the pick-off signal $v_r$. The in-phase value (i) is received in an I-channel filter 178, which is a conventional decimating digital low-pass filter, to provide a filtered value I at a lower rate such as 600 Hz. In a similar fashion, the quadrature-phase value (q) is received in a Q-channel filter 178, which also is a conventional digital low-pass decimating filter, to provide a filtered value Q at a lower rate such as 600 Hz.

Because the circuit of FIG. 18 provides both in-phase and quadrature-phase detected signals, any phase shift or tuning error between the square wave at the frequency $f_o$ and the suppressed carrier in the pick-off signal $v_r$ can be corrected by a rotation of the complex vector I+iQ, and this rotation can be performed by a numerical phase adjustment in the complex digital demodulator 177, as will be described below with reference to FIG. 22. For example, all of the detected angular-rate signal should appear in the in-phase channel I of FIG. 18. In practice, however, there will be some phase offset causing some of the angular-rate signal to appear in the quadrature-phase channel Q.

In general, the angular-rate signal $\Omega$ should have a sign that is the sign of the signal in the in-phase channel I and a corrected magnitude equal to the square root of $I^2+Q^2$. In fact, imperfections within the instrument, alignment errors, and capacitive coupling cause extraneous contributions to the I and Q signals which should be eliminated by calibration and post-processing by computing $\Omega$ from the signals I and Q after removal of the extraneous contributions. Compensation 180 for the extraneous contributions could be performed by referencing calibration data retrieved from calibration tables programmed in non-volatile memory.

Figure 19:
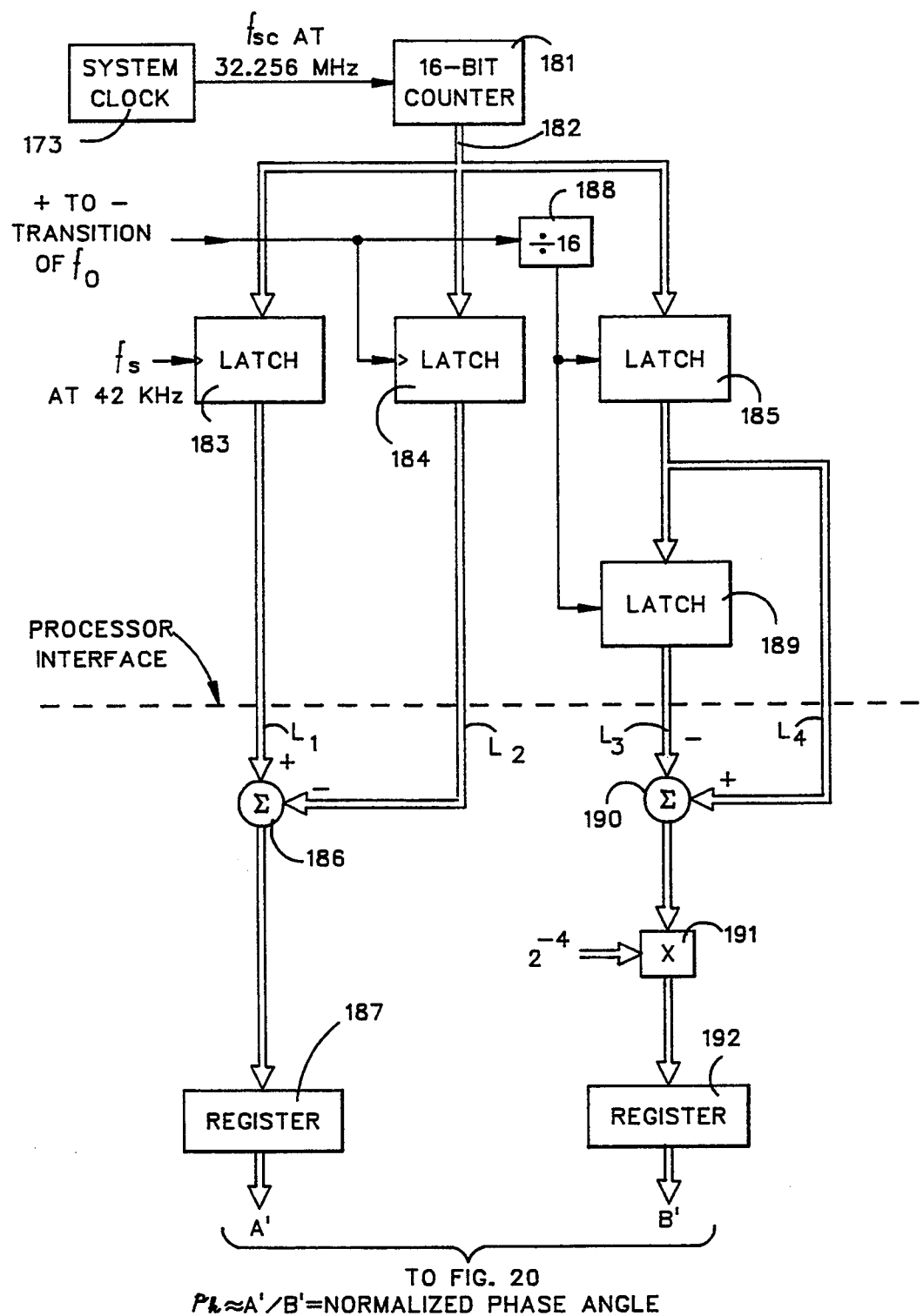
FIG. 19 is a flow diagram showing how components in the system of FIG. 18 generate a normalized phase angle associated with a sampled value being demodulated in accordance with the present invention.

Turning now to FIG. 19, there is shown a flow diagram of the preferred method for determining a normalized phase angle of the elastic vibrations of the drive tines at the time of sampling by the analog-to-digital converter (172 in FIG. 18). This particular method is conventional, and therefore FIG. 19 has been labeled "PRIOR ART." The system clock $f_{sc}$ at 32.256 MHz clocks a 16-bit counter 181 that provides 16-bit numbers on an output bus 182. The output bus 182 is connected to the data inputs of three latches 183, 184, 185. The latch 183 receives a 16-bit number from the counter 181 at the time of sampling by the analog-to-digital converter (172 in FIG. 18). The latch 184 receives a 16-bit number from the counter 181 when a high-to-low transition occurs in the square wave at the frequency $f_o$.

A subtractor 186 subtracts the number in the latch 184 from the number in the latch 183 to compute a difference A' that is received in a register 187. The difference A' represents the number of counts into a period of the signal $f_o$ when the pick-off signal $v_r$ is sampled by the analog-to-digital converter (172 in FIG. 11).

To compute the number of counts in a period of the frequency of oscillation $f_o$, a frequency divider or counter 188 provides a clocking signal once every sixteen cycles of the square wave at the frequency $f_o$. The latch 185 and a latch 189 are clocked simultaneously by this clocking signal. The latch 189 has an input receiving the output of the latch 185, so that the difference between the numbers in the two latches 185, 189 represents the number of counts at the 32.256 MHz rate within sixteen periods at the frequency $f_o$. Therefore, the average number of counts per cycle is obtained by a multiplier or shift unit 191 that divides the difference by sixteen, for example, by performing a right shift by four binary places. The average value from the multiplier or shift unit 191 is received in a register 192.

It should be apparent from FIG. 19 that the subtractors 186, 190, the multiplier or shift unit 191, and the registers 187, 192 could be components of a conventional digital data processor. In this case, the processor interface would be at the location indicated by the dashed line in FIG. 19. A specific example using a digital data processor will be further described below with reference to FIG. 21.

A normalized value of the phase angle $\rho_k$ is computed by dividing the number A' from the register 187 by the number B' from the register 192. Preferably, the quotient is computed by a polynomial approximation. It is possible to determine coefficients for a polynomial that very precisely estimate the quotient because the range of values for the number B' is rather limited. The value of B', for example, falls within the range of 3047 to 3369. For a system clock 173 at 32.256 MHz and a nominal oscillator frequency of 10 KHz, the coefficients $d_2$, $d_1$, $d_0$, for example, are 1.8719290495, minus 1.1680104733, and 0.2429249287, respectively. These coefficients give a Chebychev approximation for division Using the Remez-exchange algorithm, as derived in Appendix I. The Remez-exchange algorithm is described generally, for example, in Chi-Tsong Chen, *One-Dimensional Digital Signal Processing*, Marcel Dekker, Inc., New York, N.Y., 1979, pp. 206–215; and Rabiner and Gold, *Theory and Application of Digital Signal Processing*, Prentice-Hall, Inc., Englewood Cliffs, N.J., 1975, pp. 136–140, 194–204; which are incorporated herein by reference.

Figure 20:
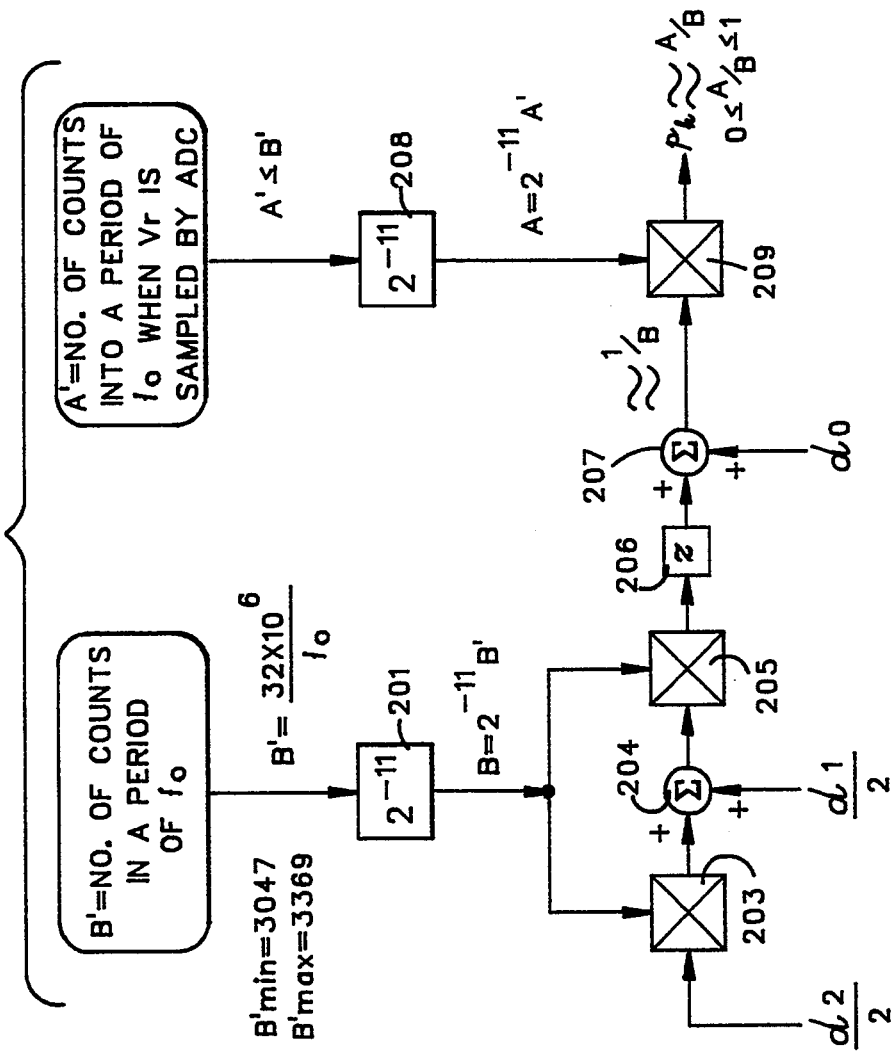
FIG. 20 is a continuation of the flow diagram in FIG. 19, and shows steps for approximating a division of two numbers derived in FIG. 19.

Shown in FIG. 20 is a flow diagram for the computation of the normalized phase angle $\rho_k$ by using the polynomial approximation. The integer number B' is converted to an internal representation B in a data processor (210 in FIG. 21) as further described below with reference to FIG. 21. The internal representation, for example, represents 12 bits of the integer number B' as an integer bit and a binary fraction. This change in representation is indicated in box 201 of FIG. 20 as a scaling of the integer number B' by a factor of $2^{-11}$ to result in the internal representation of B. The number B is multiplied by the coefficient $d_2/2$ in a first multiplier 203. An adder 204 adds the coefficient $d_1/2$ to the product from the multiplier 203. A second multiplier 205 multiplies the sum by the number B. The output of the multiplier 205 is doubled by a left-shifter 206. A second adder 207 adds the product from the shifter 206 to the coefficient $d_0$ to compute a sum that is a very good approximation of the reciprocal of the number B. The number A' is similarly changed from an integer representation to an internal representation A, as indicated in box 208 by a scale factor of $2^{-11}$. A multiplier 209 multiplies the number A by the reciprocal 1/B from the adder 207. The product from the multiplier 209 is the normalized phase angle $\rho_k$.

Figure 21:
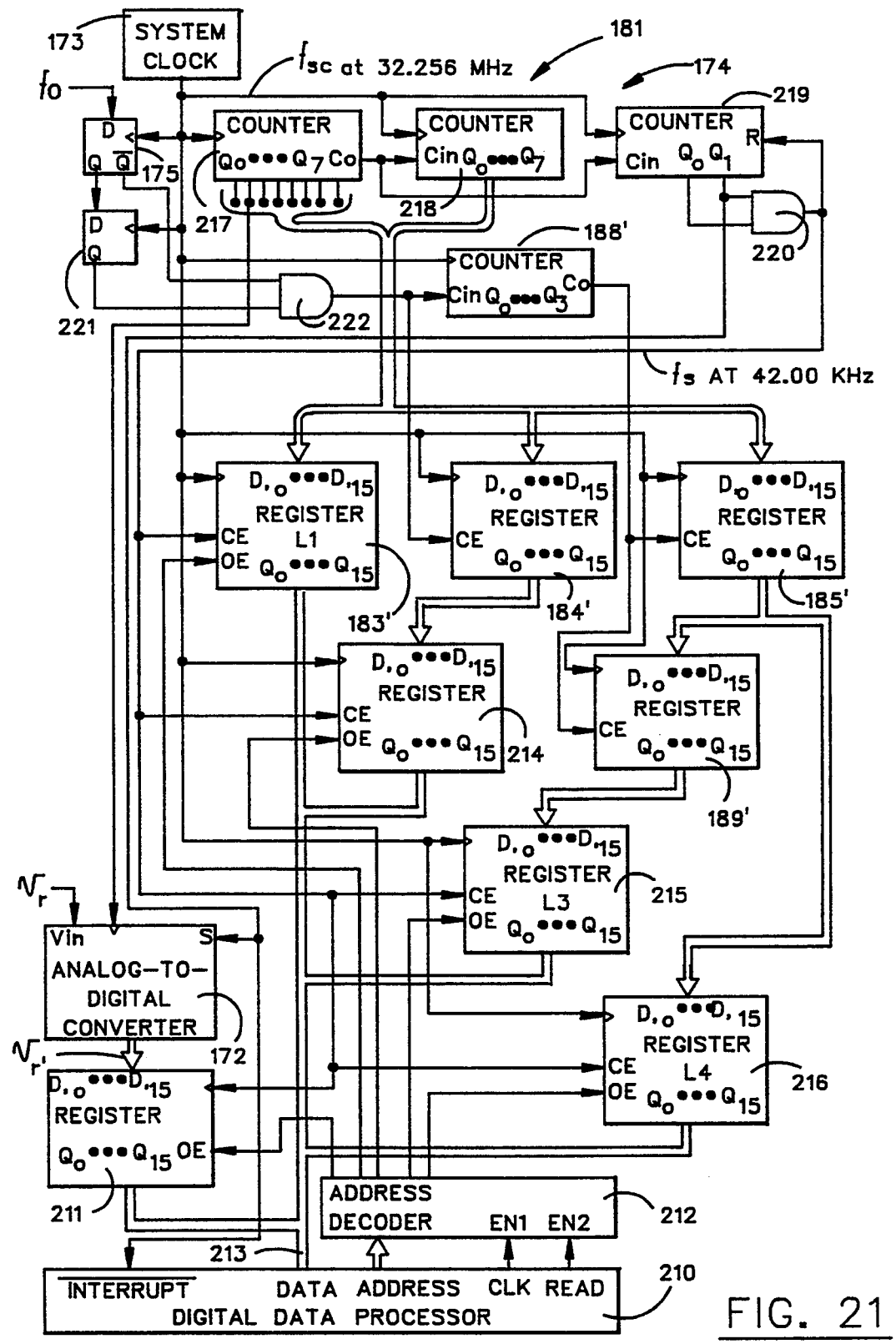
FIG. 21 is a schematic diagram of synchronous logic circuits corresponding to the digital circuits in FIG. 18.

Turning now to FIG. 21, there is shown a schematic diagram of synchronous logic circuits corresponding to the digital components of the block diagram of FIG. 18. Also shown in FIG. 21 are all of the counters 174, a D flip-flop 175' corresponding to the 1-bit ADC 175 in FIG. 18, the analog-to-digital converter 172, a register 211 associated with the analog-to-digital converter 172, register 183', 184', 185' and 189', corresponding to the latches 183, 184, 185 and 189' in FIG. 19, and a digital data processor 210 that is programmed to perform computations for the phase angle generator 176 and to function as the complex digital demodulator 177 of FIG. 18.

The digital data processor 210, for example, is a Star Semiconductor SPROC programmable digital signal processing (DSP) integrated circuit which is designed for fixed-point 24-bit arithmetic. The digital data processor 210 has an associated address decoder 212 for enabling either the register 211, the register 183', or the registers 214, 215, or 216 to transmit data to the data processor via a sixteen-bit data bus 213. The registers 211, 183', 214, 215, and 216 are all clocked at the 42.00 KHz sampling rate and have tri-state outputs for multiplexed transmission of data to the digital data processor 210 when the digital data processor is interrupted at the 42.00 KHz sampling rate. The analog-to-digital converter, for example, is an Analog Devices part No. AD676 16-bit 100 kSPS sampling ADC which uses a switched-capacitor/charge redistribution architecture to achieve a 10 microsecond total conversion time.

As further shown in FIG. 21, the 16-bit counter 181 includes two eight-bit synchronous counters 217 and 218. The carry-out of the counter 217 provides a frequency of 126.00 KHz, which is divided by three by a synchronous two-bit counter 219 and an AND gate 220 to generate the sampling frequency $f_s$ at 42.00 KHz.

Positive-to-negative transitions in the square wave at the frequency $f_o$ are detected by a D flip-flop 221 and an AND gate 222. A four-bit synchronous counter 188' is enabled by the AND gate 222 to provide the divide-by-16 function 188 of FIG. 19.

The digital data processor 210 executes an interrupt routine at the 42.00 KHz sampling rate in order to compute the normalized phase angle $\rho_k$ by following the steps introduced above in FIGS. 19 and 20. The interrupt routine, for example, is programmed according to the following listing:

```
*** INPUT DATA FROM THE INTERFACE ***
INTERRUPT     INPUT VR
              INPUT L1
              INPUT L2
              INPUT L3
              INPUT L4
*** COMPUTE A AND B ***
              A ← L1-L2
              B ← L3-L4
              ARITHMETIC RIGHT SHIFT A BY 11
              ARITHMETIC RIGHT SHIFT B BY 15
*** COMPUTE APPROXIMATION OF A/B ***
*** NOTE:             ***
*** D2 = 1.8719290495  ***
*** D1 = -1.1680104733 ***
*** D0 = 0.2429249287  ***
              PHASE ← D2/2 * B
              PHASE ← PHASE + D1/2
              PHASE ← PHASE * B
              LEFT SHIFT PHASE BY 1
              PHASE ← PHASE + D0
              PHASE ← PHASE * A
```

In accordance with an important aspect of the present invention, the complex digital demodulator computes synthetic sine and cosine functions of the phase angle $\rho_k$. The synthetic sine and cosine functions of the phase angle $\rho_k$ are multiplied by the sampled value of the pick-off signal $v_r$ to compute the in-phase sample (i) and the quadrature-phase sample (q). Preferably the synthetic cosine function of the phase angle is Chebychev-approximation derived, and an appropriate derivation is given in Appendix II below. The sine approximation is derived from the cosine approximation by a 90° phase shift. The degree of approximation has been selected to keep the I-channel frequency-domain artifacts below −90 dB, and to keep those of the less demanding Q-channel below −70 dB.

Figure 22:
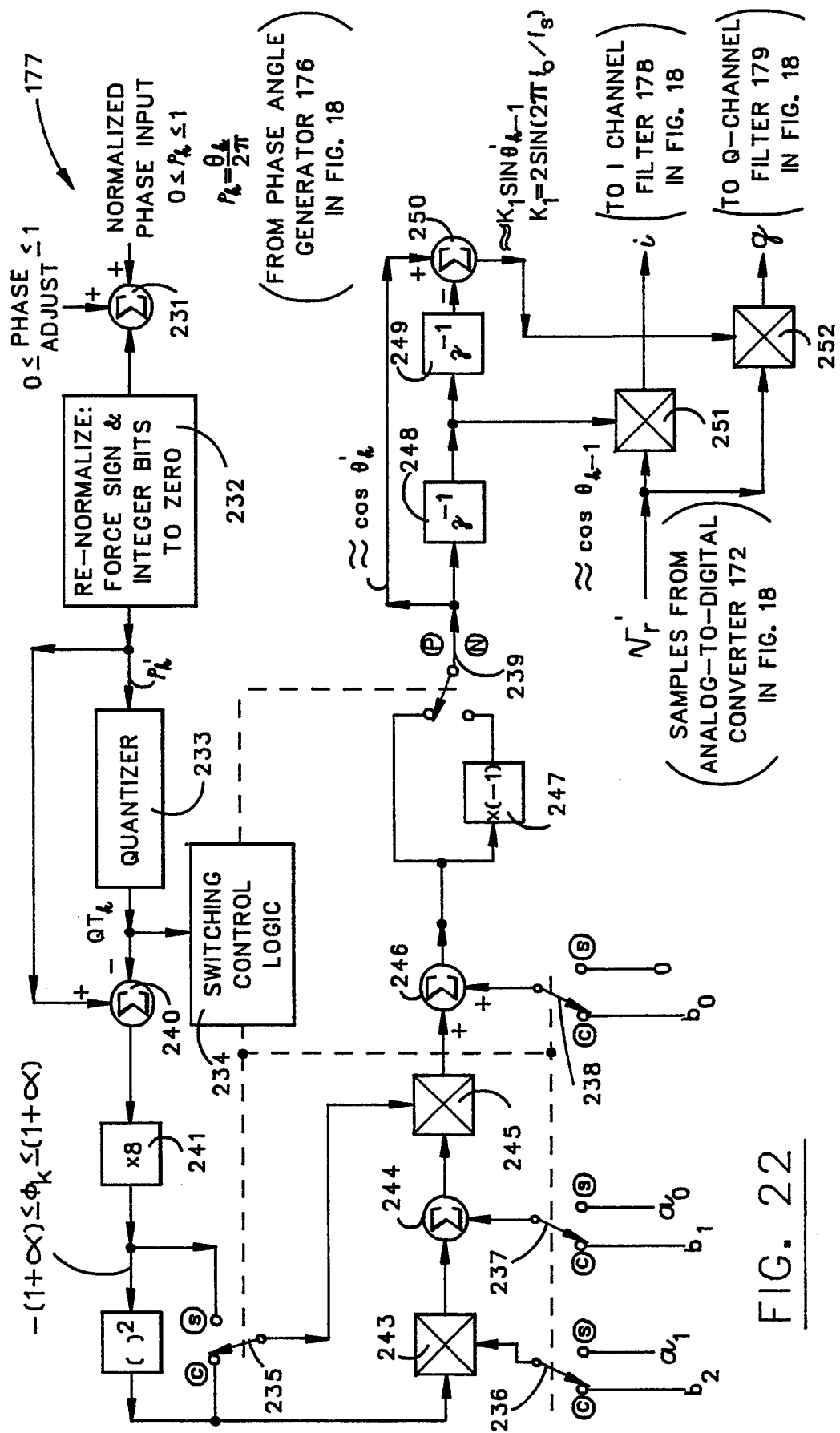
FIG. 22 is a schematic diagram of a digital filter representation of the complex demodulator in accordance with the present invention.

Turning now to FIG. 22, there is shown a schematic diagram of a digital filter representation for a preferred embodiment of the complex digital demodulator 177. An adder 231 adds the normalized phase angle $\rho_k$ to a predetermined positive phase adjustment retrieved from non-volatile memory. The sum from the adder 231 is re-normalized, as represented by a box 232, to provide a phase-adjusted and re-normalized phase angle $0 \leq \rho_k' \leq 1$. In the data processor 210 of FIG. 21, this re-normalization is a truncation step performed by setting sign and integer bits to zero. In other words, the sum from the adder 231 is logically ANDed with a mask having logical ones in the fraction positions and logical zeros in the sign bit position and in the integer bit position.

In the complex digital demodulator 177 of FIG. 22, a numerical approximation is computed for the cosine of the phase-adjusted phase angle $\rho_k'$. An approximation of the sine of the phase-adjusted phase angle $\rho_k'$ is then computed as a differential of the synthetic cosine function. The synthetic cosine function is computed as either an odd or an even polynomial function of a converted phase angle $\phi$ that is a discontinuous linear function of the phase-adjusted phase angle $\rho_k'$. The odd polynomial function is an approximation of a sine function over an angular range of $\pm 45(1-\alpha)$ degrees. The even polynomial function is an approximation of a cosine function over an angular range of $\pm 45(1+\alpha)$ degrees. The even and odd polynomial functions have a similar computational complexity. The parameter $\alpha$ ($\alpha \approx \frac{1}{4}$) is selected so that the maximum approximation error for the even polynomial function is approximately equal to the maximum approximation error for the odd polynomial function. Therefore the polynomial functions, and the parameter $\alpha$, are chosen so that the approximation errors are minimax over the entire angular range.

Figure 23:
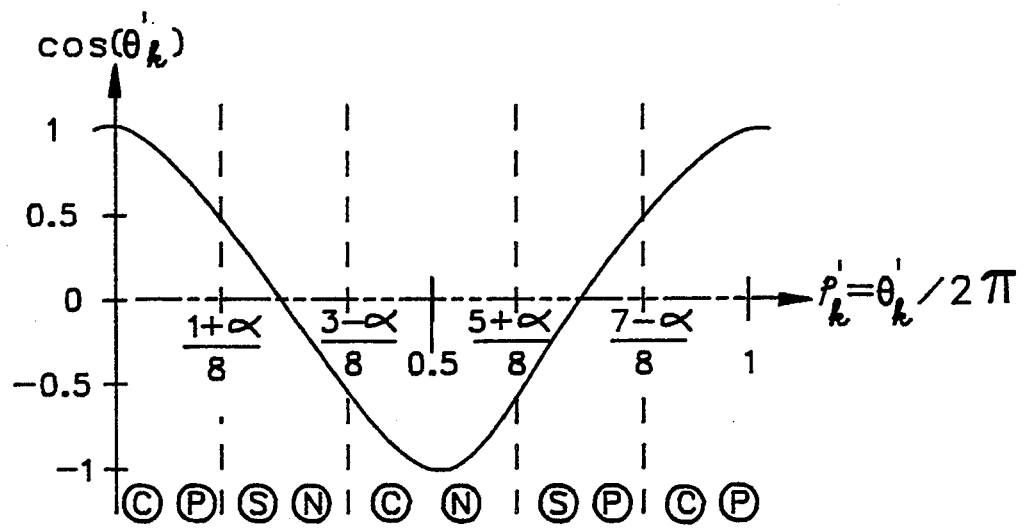
FIG. 23 is a graph of a cosine function of an adjusted and normalized phase angle.

As shown in FIG. 23, the cosine waveform of the phase-adjusted phase angle $\rho_k'$ is spliced from positive (P) or negative (N) versions of the odd polynomial function (S) or the even polynomial function (C). The boundaries between these spliced functions occur at normalized phase angles of $(1+\alpha)/8$, $(3-\alpha)/8$, $(5+\alpha)/8$, and $(7-\alpha)/8$.

Figure 24:
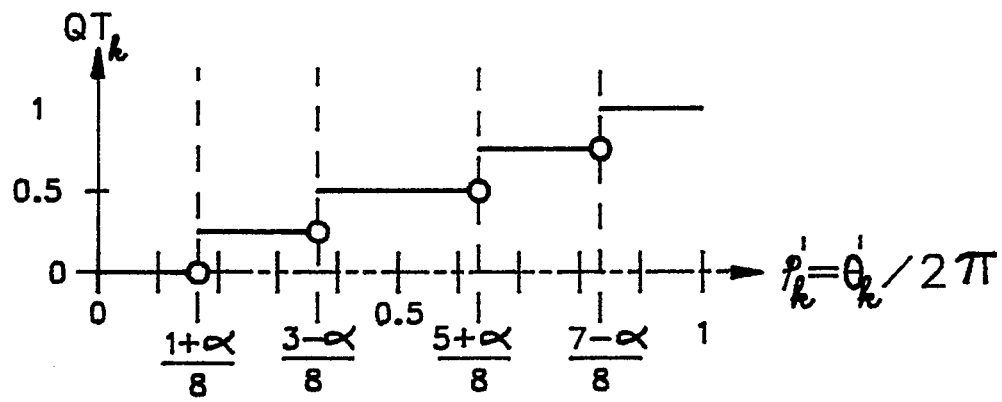
FIG. 24 is a graph of a quantization function used in the complex digital demodulator of FIG. 22.

Returning for a moment to FIG. 22, it is seen that the phase-adjusted phase angle $\rho_k'$ is received in a quantizer 233 providing a quantized function $QT_k$. As shown in FIG. 24, the quantized function $QT_k$ has discontinuities at the boundaries between the spliced functions. The quantized function $QT_k$ has values of:

$QT_k = 0$ for $0 \leq \rho_k' < (1+\alpha)/8$ $QT_k = \frac{1}{4}$ for $(1+\alpha)/8 \leq \rho_k' < (3-\alpha)/8$ $QT_k = \frac{1}{2}$ for $(3-\alpha)/8 \leq \rho_k' < (5+\alpha)/8$ $QT_k = \frac{3}{4}$ for $(5+\alpha)/8 \leq \rho_k' < (7-\alpha)/8$ $QT_k = 1$ for $(7-\alpha)/8 \leq \rho_k' \leq 1$ Returning again to FIG. 22, it is seen that the quantized values $QT_k$ are received by switching control logic 234 that controls switches 235, 236, 237, and 238 in accordance with whether the value of $QT_k$ corresponds to the angular range for either an even polynomial function (C) or an odd polynomial function (S), and that controls a switch 239 in accordance with whether the value of $QT_k$ corresponds to the angular range for either a positive polynomial function (P) or a negative polynomial function (N), as was introduced in FIG. 23. The switches 235 to 238 are set in the (C) position when $QT_k$ has a value of 0, ½, or 1, and are set in the (S) position when $QT_k$ has a value of ¼ or ¾. The switch 235 determines whether the polynomial function will be even or odd. The switches 236, 237 and 238 select either predetermined constant coefficients $b_2$, $b_1$, and $b_0$ for the even polynomial function, or predetermined constant coefficients $a_1$, $a_0$, and 0, for the odd polynomial function. As determined by the computer program in Appendix II, the coefficients, for example, are:

$$b_2 = 0.0151071548$$

$$b_1 = -0.3079915047$$

$$b_0 = 0.9999626875$$

$$a_1 = -0.0790057182$$

$$a_0 = 0.7851537466$$

The switch 239 is set in the (P) position when $Q_k$ has a value of 0 or ¾ or 1, and is set in the (N) position when $QT_k$ has a value of ¼ or ½.

Figure 25:
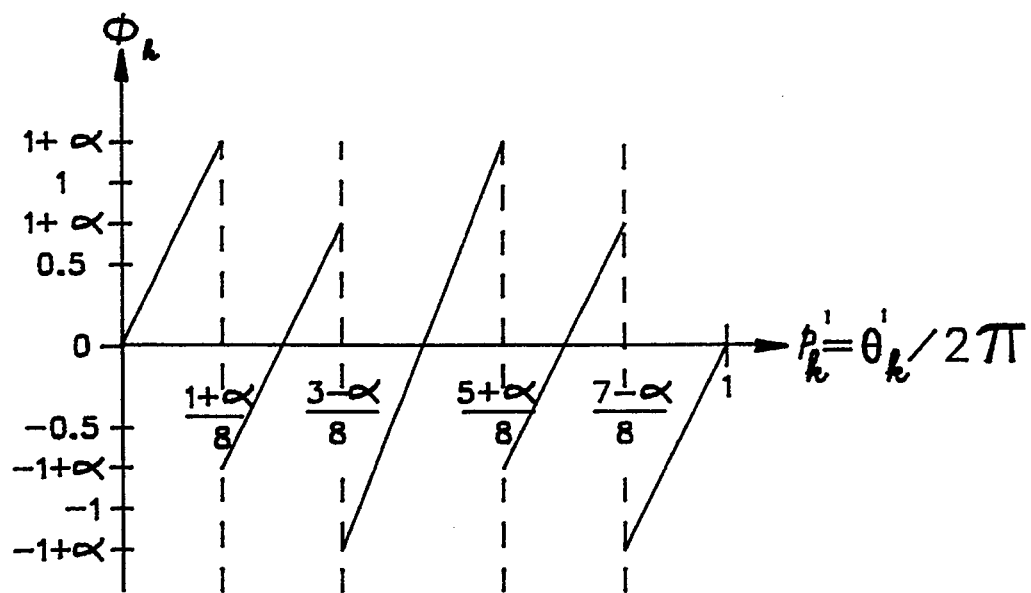
FIG. 25 is a graph of a converted phase angle, which is the domain of certain odd and even polynomial functions that are spliced together to synthesize a sinusoidal signal in the complex demodulator of FIG. 22.

The quantized function $QT_k$ is also used to produce the converted phase angle $\phi_k$. A subtractor 240 subtracts the quantized function $QT_k$ from the phase-adjusted phase angle $\rho_k'$. A multiplier 241 multiplies the difference by eight, for example, by an arithmetic left shift by three binary places. The converted phase angle $\phi_k$ therefore ranges from $-1-\alpha$ to $1+\alpha$, as shown in FIG. 25. The odd and even polynomial functions, as introduced above, are polynomial functions of this converted phase angle $\phi_k$. As shown in FIG. 22, the odd polynomial function is given by:

$$(a_1\phi_k^2 + a_0)\phi_k = a_1\phi_k^3 + a_0\phi_k$$

and the even polynomial function is given by:

$$((b_2\phi_k^2 + b_1)\phi_k^2) + b_0 = b_2\phi_k^4 + b_1\phi_k^2 + b_0.$$

In either case, a multiplier 242 computes the square of $\phi_k$. A multiplier 243 scales the square of $\phi_k$ by either the constant coefficient $b_2$ or the constant coefficient $a_1$, as selected by the switch 236. An adder 244 adds to the product either the constant coefficient $b_1$ or the constant coefficient $a_0$, as selected by the switch 237. A multiplier 245 multiplies the sum by either $\phi_k^2$ or $\phi_k$, as selected by the switch 235. The product from the multiplier 245 is received by an adder 246, which adds either the constant coefficient $b_0$ or a value of zero. The sign of the sum from the adder 246 is changed in a complement unit 247. The switch 239 selects either the sum from the adder 246, or the complemented value from the complement unit 247, to produce the cosine waveform $\cos(\theta_k')$ shown in FIG. 23.

The complex demodulator 177 synthesizes two sinusoid functions, in phase quadrature, and responsive to the phase-adjusted phase angle $\rho_k'$. As shown in FIG. 22, a sine function $K_1 \sin\theta'_{k-1}$, where $K_1 = 2\sin(2\pi f_0/f_s)$, is computed as a differential of the cosine function $\cos\theta_k'$. A first register 248 delays the value of $\cos\theta_k'$ for one period of the sampling frequency $f_s$, to provide a cosine function $\cos\theta'_{k-1}$. A second register 249 delays the value from the first register 248 by another period of the sampling frequency $f_s$. A subtractor 250 computes the difference between the value of $\cos\theta_k'$ and the value from the second register 249, to produce the sine function $K_1\sin\theta'_{k-1}$ in phase-quadrature with the cosine function $\cos\theta'_{k-1}$ from the first register 248.

To produce the in-phase product samples (i), a multiplier 251 multiplies the samples $v_r'$ from the analog-to-digital converter (172 in FIG. 18) by the cosine function $\cos\theta'_{k-1}$ from the first register 248. In a similar fashion, another multiplier 252 multiplies the samples $v_r'$ by the sine function $K_1\sin\theta'_{k-1}$ from the subtractor 250, to produce the quadrature-phase product samples (q).

The complex digital demodulator 177 as shown in FIG. 22 could be made as an integrated circuit, or as a part of a larger integrated circuit, or made of discrete pipelined digital logic units, corresponding to the blocks shown in FIG. 22. The switches 235 to 239, for example, would be digital multiplexers. Alternatively, a digital data processor, such as the data processor 210 in FIG. 21, could perform the operations indicated in FIG. 22 sequentially when interrupted at the sampling frequency. The interrupt routine as introduced above would continue as follows:

```
*** COMPLEX DIGITAL DEMODULATOR ***
*** COMPUTE ADJUSTED PHASE ***
        PHASE ← PHASE + PHASE_ADJUST
*** RE-NORMALIZE THE ADJUSTED PHASE ***
*** BY MASKING OFF SIGN AND INTEGER BITS ***
        PHASE ← PHASE .AND. MASK
*** PERFORM THE QUANTIZING OF THE ADJUSTED
PHASE ***
        IF PHASE ≧ (5+α)/8 THEN GOTO LEVEL4
        IF PHASE ≧ (1+α)/8 THEN GOTO LEVEL2
        QT ← 0
        CSWITCH ← TRUE
        PSWITCH ← TRUE
        GOTO ENDQUANT
LEVEL2: IF PHASE > (3−α)/8 THEN GOTO LEVEL3
        QT ← 0.25
        CSWITCH ← FALSE
        PSWITCH ← FALSE
        GOTO ENDQUANT
LEVEL3: QT ← 0.5
        CSWITCH ← TRUE
        PSWITCH ← FALSE
        GOTO ENDQUANT
LEVEL4: IF PHASE ≧ (7−α)/8 THEN GOTO LEVEL5
        QT ← 0.75
        CSWITCH ← FALSE
        PSWITCH ← TRUE
        GOTO ENDQUANT
LEVEL5: QT ← 1.0
        CSWITCH ← TRUE
        PSWITCH ← TRUE
*** COMPUTE CONVERTED PHASE ANGLE ***
ENDQUANT: PHASE ← PHASE − QT
*** MULTIPLY PHASE BY EIGHT ***
        LEFT SHIFT PHASE BY THREE
*** BEGIN POLYNOMIAL COMPUTATION ***
        PHASESQ ← PHASE * PHASE
*** BRANCH TO COMPUTATIONAL SEQUENCE FOR ***
*** EITHER ODD OR EVEN POLYNOMIAL ***
*** STORED VALUES OF CONSTANT COEFFICIENTS:
*** B2 = 0.0151071548       ***
*** B1 = −0.3079915047      ***
*** B0 = 0.9999626875       ***
*** A1 = −0.0790057182      ***
*** A0 = 0.7851537466       ***
```

```
            -continued
        IF (CSWITCH = FALSE) THEN GOTO ODD:
*** COMPUTATION FOR EVEN POLYNOMIAL ***
        POLY ← PHASESQ * B2
        POLY ← POLY + B1
        POLY ← POLY * PHASESQ
        POLY ← POLY + B0
        GOTO ENDPOLY
*** COMPUTATION FOR ODD POLYNOMIAL ***
        POLY ← PHASESQ * A1
        POLY ← POLY + A0
        POLY ← POLY * PHASE
*** SELECT POSITIVE OR NEGATIVE OF THE
POLYNOMIAL **
ENDPOLY: IF (PSWITCH = FALSE) THEN POLY ← −POLY
*** COMPUTE SINE FUNCTION ***
        SINE ← POLY − REG2
*** COMPUTE I AND Q PRODUCTS ***
        IPRODUCT ← REG1 * VR
        QPRODUCT ← SINE * VR
*** UPDATE DELAY REGISTERS **
        REG2 ← REG1
        REG1 ← POLY
```

Appendix III below shows a FORTRAN program including specific instructions for performing the complex demodulation method of the invention.

Figure 26:
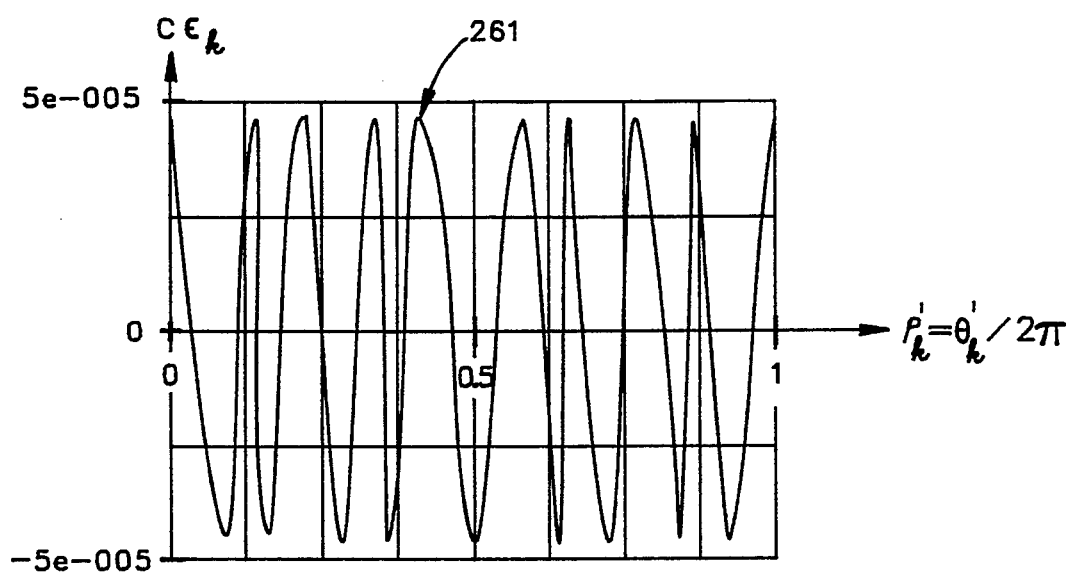
FIG. 26 is a graph of an error function representing the error in a synthesized cosine signal in the complex demodulator of FIG. 22.

Turning now to FIG. 26, there is shown a graph 261 of the error function $C\epsilon_k$ representing the difference between $COS(\theta'_k)$ and the approximation resulting from switch 239 in FIG. 22. The error function clearly is equi-ripple and always has a magnitude less than $5 \times 10^{-5}$.

In view of the above, there has been described a method of demodulating a digital signal by a reference frequency signal that is computationally efficient and provides a digitized demodulated signal that is synchronized to a system clock. For demodulating a signal from a quartz angular rate signal, the method permits the computations to be performed by a conventional programmed digital signal processor. Moreover, a quadrature-phase demodulated signal can be provided with a minimal increase in computational complexity, because an approximation of a quadrature-phase sinusoidal function can be computed as a differential of the approximation of the in-phase sinusoidal function.

It should be apparent that the illustrated embodiments of the invention can be modified in various ways without departing from the scope of the invention as defined by the appended claims. In particular, the magnitude of the error function as shown in FIG. 26 can be reduced considerably by approximating the even (C) and odd (S) polynomial functions with one or more additional terms. For each additional term, a multiplier, adder, and switch is added to the circuit of FIG. 22. For example, to add one additional term to each of the even (C) and odd (S) polynomial functions, an additional adder would be inserted in series between the switch 236 and the multiplier 243 of FIG. 2, and an additional multiplier would be connected to the additional adder so that the product of the additional multiplier is added in the additional adder to the constant selected by the switch 36 and the sum from the additional adder is received by the multiplier 243. The additional multiplier would multiply the output of the squaring unit 242 by the constant coefficient of the additional term in the even (C) or odd (S) polynomial, as selected by an additional switch.

APPENDIX I.

MATHCAD (Trademark) DESIGN PROGAM
CHEBYCHEV APPROXIMATION FOR DIVISION
USING THE REMEZ-EXCHANGE ALGORITHM
QRSDIVIDE1.MCD

*************************************************************

We form the quotient x/y by evaluating 1/y and multiplying the result by x. The objective of this program is to calculate the "b" coefficients that provide the Chebychev solution to 1/y. The application is a divide approximation to go into the SPROC.

*************************************************************

INITIALIZE $L := 10 \quad q := 0 \ldots L$ $F_o := 32 \cdot 10^6$

This sets the frequency of the fork.

Fast clock frequency $f_o := 9500 + 100 \cdot 1$

Nominal frequency of oscillation of the fork.

$Y_{max} := \dfrac{F_o \cdot 2^{-11}}{f_o - 100}$

Maximum value of the input variable.
$Y_{max} = 1.5024038462$ $Y_{max} := \dfrac{F_o \cdot 2^{-11}}{f_o + 100}$ Maximum value of the input variable.
$Y_{min} = 1.4740566038$

| | |
|---|---|
| B := 32 | Number of bits of coefficient resolution. |
| N := 3 | Number of coefficients in data-fitting routine. (This is determined by trial and error.) |
| n := 0 ..N | Coefficient index. |
| m := 0 ..N | The y-value index. |
| p := 0 ..N - 1 | The weighting-coefficient ("b") index. |
| K := 1000 | Number of performance-evaluation points. |
| k := 0 ..K - 1 | Performance-evaluation index. |

ZERO$_m$ := 0   PRNCOLWIDTH := 10   PRNPRECISION := 10   C := 0 □   1 ≡ 10
WRITE(FCLOCK) := F$_0$           WRITEPRN(YA) := ZERO □ q,p
                                 WRITE(COUNT) := 0 □ WRITEPRN(C) := C □

TYPE "PROCESS", COMMENT "WRITEPRN(YA)" & "WRITE(COUNT)",
THEN GOTO 125.

*********************************************************************

SETUP

ITERATION := READ(COUNT)        WRITE(COUNT) := 1 + ITERATION
YA := READPRN(YA)

$$Y_m := if\left[ITERATION = 0, Y_{min} + [Y_{max} - Y_{min}] \cdot \frac{m}{N}, YA_m\right]$$

The extremal values of the independent variable, y.

$$M_{m,n} := if\left[n = N, (-1)^m, Y_m^n\right]$$

The Remez matrix.

$$y_k := Y_{min} + [Y_{max} - Y_{min}] \cdot \frac{k}{K - 1}$$

The performance-evaluation variable.

$$R := \left[\frac{1}{Y}\right] \qquad REF := \left[\frac{1}{y}\right]$$

R is the functional reference vector; REF is the performance-reference vector.

$$v := M^{-1} \cdot R \qquad \epsilon := v_N$$

v is the solution vector; ε is the error measure.

$$b_p := 2^{-B} \cdot floor\left[0.5 + 2^B \cdot v_p\right]$$

WRITEPRN(BCOEFF) := b

*********************************************************************

PERFORMANCE EVALUATION $$AF := \left[\sum_p b_p \cdot y^p\right]$$ The approximating function.

ERROR := REF - AF     The performance error.

The plot of the error-extremal envelope bounded by $\epsilon'$:

$\epsilon' := if[\epsilon \approx 0, \max[(|ERROR|)], |\epsilon|]$     Another index: $i := 0 .. 1$ This is the error-extremal envelope plot:

$EY_k := if[k = K - 1, 0, if[ERROR_{k+1} \geq ERROR_k, \epsilon', -\epsilon']]$

This filter (MASK) is used to locate the frequencies corresponding to all extremal error values plus the end points:

$MASK_k := if[k = 0, 1, if[k = K - 1, 1, if[EY_{k+1} = -EY_k, 1, 0]]]$

This is the actual frequency-filtering operation. The only frequencies that get through are the end points plus those where error extrema are located.

$MATRIX_{k,0} := y_k \cdot MASK_k \qquad MATRIX_{k,1} := |ERROR_k| \cdot MASK_k$ Extract the frequencies where the N+1 largest end-point values and extremal values are located, sort them, and write them into memory:

$MYE_{m,i} := reverse(csort(MATRIX, 1))_{m,i} \qquad SYE := (csort(MYE, 0))$ $|\epsilon| = 1.45 \cdot 10^{-7}$     $WRITEPRN(YA) := SYE^{<0>}$ $\max[(|ERROR|)] - |\epsilon| = 3.07 \cdot 10^{-10}$     A sanity check.

$floor\left[\frac{-\log[\max(|ERROR|)]}{\log(2)}\right] = 22$     Accuracy performance level measured in bits.
Compute the peak error in ppm $\max[(|ERROR|)] \cdot 10^6 = 0.15$ List the extremal frequencies (col 0), and the extremal value magnitudes (col 1):     The rounded coefficients:

$SYE = \begin{bmatrix} 1.4740566038 & 0.0000001449 \\ 1.481093757 & 0.0000001454 \\ 1.4952531904 & 0.0000001449 \\ 1.5024038462 & 0.0000001453 \end{bmatrix} \qquad b = \begin{bmatrix} 2.0159386431 \\ -1.354638814 \\ 0.3034160961 \end{bmatrix}$ $C := READPRN(C) \quad D_{p,q} := if\left[q = 1, b_p, (C^T)_{p,q}\right]$ $$WRITEPRN(C) := D^T$$

$$D^T = \begin{bmatrix} 1.823932288 & -1.108878941 & 0.224712004 \\ 1.843132984 & -1.132349009 & 0.2318840621 \\ 1.862333664 & -1.156064836 & 0.2392071148 \\ 1.881534332 & -1.180026423 & 0.2466827354 \\ 1.900734985 & -1.20423377 & 0.2543124964 \\ 1.919935625 & -1.228686878 & 0.262097971 \\ 1.939136253 & -1.253385745 & 0.2700407321 \\ 1.958336868 & -1.278330372 & 0.2781423521 \\ 1.977537471 & -1.30352076 & 0.2864044043 \\ 1.996738063 & -1.328956907 & 0.2948284613 \\ 2.0159386431 & -1.354638814 & 0.3034160961 \end{bmatrix}$$

END OF PROGRAM

************************************************************
************************************************************

A PROGRAM TO DETERMINE THE COEFFICIENTS AND ASSESS
THE PERFORMANCE OF THE DIVIDER
QRSDIVAPROX.MCD

************************************************************

C := READPRN(C)    This matrix has been computed by
                   program QRSDIVIDE1.MCD Division matrix obtained from Remez-exchange algorithm:

$$C = \begin{bmatrix} 1.823932288 & -1.108878941 & 0.224712004 \\ 1.843132984 & -1.132349009 & 0.2318840621 \\ 1.862333664 & -1.156064836 & 0.2392071148 \\ 1.881534332 & -1.180026423 & 0.2466827354 \\ 1.900734985 & -1.20423377 & 0.2543124964 \\ 1.919935625 & -1.228686878 & 0.262097971 \\ 1.939136253 & -1.253385745 & 0.2700407321 \\ 1.958336868 & -1.278330372 & 0.2781423521 \\ 1.977537471 & -1.30352076 & 0.2864044043 \\ 1.996738063 & -1.328956907 & 0.2948284613 \\ 2.0159386431 & -1.354638814 & 0.3034160961 \end{bmatrix}$$

i := 0 ..2                Divider-coefficient index j := 0 ..3                Approximator-matrix index k := 0 ..10               Frequency index l := 0 ..100              A display index $F_{k,j} := (9500 + 100 \cdot k)^j$    A frequency matrix $A := (F^T \cdot F)^{-1} \cdot F^T \cdot C$    Matrix of polynomial coefficients
                                               that we use to compute the divider
                                               coefficients.

$$A = \begin{bmatrix} -2.6017846722 \ 10^{-4} & 1.1232068209 \ 10^{-4} & 2.3860820875 \ 10^{-8} \\ 1.9203872152 \ 10^{-4} & 5.9873173086 \ 10^{-10} & -4.6988751778 \ 10^{-9} \\ -2.6468644984 \ 10^{-12} & -1.2288017067 \ 10^{-8} & 3.0958444358 \ 10^{-15} \\ 0 & 0 & 2.6214369445 \ 10^{-13} \end{bmatrix}$$

10

$A'_{j,i} := A_{j,i} + (i = 0) \cdot (j = 0) \cdot 1.63 \cdot 10^{-6}$

An empirically determined numerical roundoff correction $\delta f_i := -100 + 2 \cdot i$ This is the frequency range (+/- 100 Hz) over which our division approximation must hold.

$fm_j := f_0^j$

A frequency matrix to obtain the divider coefficients from the A values. The fork frequency of oscillation is $f_0 = 9750$ $d := A'^T \cdot fm$ This is how we obtain the divider coefficients, d ...

$d' := 2^{-23} \cdot \overline{ceil\ [0.5 + 2^{23} \cdot d]}$

... then we round them to SPROC accuracy ...

$$d' = \begin{bmatrix} 1.8719290495 \\ -1.1680104733 \\ 0.2429249287 \end{bmatrix}$$

... and here they are! Now, let's see how well they work ...

5   $F_0 := READ(FCLOCK)$

The frequency of the fast clock. $F_0 = 32000000$ $INPUT_{1,\cdot} := \left[MIN\_INPUT + (MAX\_INPUT - MIN\_INPUT \cdot \frac{1}{100}\right]^i$ $ANS := \left[\overline{\frac{1}{INPUT^{<1>}}}\right]$ $COMPUTE := INPUT \cdot d'$ $NERROR := 1 - \overline{INPUT^{<\cdot>} \cdot COM}$ $f_0 = 9750$ The nominal fork frequency of oscillation.

10

END OF PROGRAM
************************************************************

APPENDIX II

MATHCAD DESIGN PROGRAM
CHEBYCHEV-APPROXIMATION-DERIVED SYNTHETIC SINE AND
COSINE FUNCTIONS FOR THE QRS DEMODULATOR REFERENCE.
QRSSINEWHEN.MCD

****************************************************************

INITIALIZE

We need some user-defined functions:

SGN(x) := if (x $\geq$ 0,1,-1

CONDX(x,y) := (x > 0) · (x > y) + (x < 0) · (x < y) + SGN(x) $\neq$ SGN(y)

SGNCHG(x,y) := if(CONDX(x,y) > 0,-1,1)

| | |
|---|---|
| B := 23 | Number of bits of coefficient resolution. |
| i := 0 ..1 | The sine (i=0) cosine (i=1) index |
| K := 512 | Number of performance-evaluation points. |
| k := 0 ..K - 1 | Performance-evaluation index. |
| l := 0 ..0.5·K | The FFT-display index. |
| M := 2 | Number of coefficients in sine-fitting routine. |
| N := M + 1   N = 3 | Number of coefficients in cosine-fitting routine. |
| m := 0 ..M | m and n are sine-fitting coefficient indices. We require |
| n := 0 ..M | a pair of them to index our square (M+1) x (M+1) matrices. |
| p := 0 ..N | p and q are cosine-fitting coefficient indices. Again, we |
| q := 0 ..N | require a pair of them to index our square (N+1) x (N+1) matrices. |
| r := 0 ..M - 1 | Sine weighting-coefficient ("a") index. |
| s := 0 ..N - 1 | Cosine weighting-coefficient ("b") index. |

WRITE(DELTA_ALPHA) := 0.001°
WRITE(ALPHA) := 0°         WRITE(DELTA) := 1°
$SZERO_m$ := 0   $CZERO_p$ := 0   WRITEPRN(XA) := SZERO °   PRINTCOLWIDTH := 10
                         WRITEPRN(YB) := CZERO °   PRNPRECISION := 10
XA := READPRN(XA)        WRITE(COUNT) := 0 °        YB := READPRN(YB)

Comment all WRITE(*) statements and goto 160.

****************************************************************

SETUP

ITERATION := READ(COUNT)   WRITE(COUNT) := 1 + ITERATION   ITERATION = 6

$\alpha$ := if [ITERATION = 0, 0.25, READ(ALPHA)]   The waveforms are spliced from unequal segments of sines and cosines. $\alpha$ is the measure of the inequality.

20   $\alpha = 0.253$

The independent variables are x and y:

$$X_m := if\left[ITERATION = 0, (1-\alpha)\cdot\frac{m}{M}, XA_m\right]$$

$$Y_p := if\left[ITERATION = 0, (1+\alpha)\cdot\frac{p}{N}, YB_p\right]$$

$$MX_{m,n} := if\left[n = M, (-1)^m \cdot if\ (m=M, 0.001, 1), X_m^{2\cdot n+1}\right]$$

25

Remez matrix for the sine-approximation.

$$MY_{p,q} := if\left[q = N, (-1)^p \cdot if\ (p=N, 0.001, 1), Y_p^{2\cdot q}\right]$$

Remez matrix for the cosine-approximation.

$$P := \overline{\sin\left[\frac{\pi}{4}\cdot X\right]} \qquad Q := \overline{\cos\left[\frac{\pi}{4}\cdot Y\right]}$$

The reference vectors

5   $u := MX^{-1}\cdot P \qquad v := MY^{-1}\cdot Q$

The solution vectors.

$$a_r := 2^{-B}\cdot floor\left[0.5 + u_r\cdot 2^B\right]$$

B-bit rounded coefficient vector for the sine ...

$$b_s := 2^{-B}\cdot floor\left[0.5 + v_s\cdot 2^B\right]$$

... and for the cosine.

$\epsilon_0 := u_M \qquad \epsilon_1 := v_N$

The error measures.

$$x_{k,0} := \frac{\pi}{4}\cdot(1-\alpha)\cdot\frac{k}{K-1} \qquad x_{k,1} := \frac{\pi}{4}\cdot(1+\alpha)\cdot\frac{k}{K-1}$$

10

The performance-evaluation variables.

$$REF^{\langle 0\rangle} := \overline{\sin[x^{\langle 0\rangle}]} \qquad REF^{\langle 1\rangle} := \overline{\cos[x^{\langle 1\rangle}]}$$

The reference functions.

The approximating functions are:

$$AF^{\langle 0\rangle} := \overline{\left[\sum_r a_r\cdot\left[\frac{4}{\pi}\cdot x^{\langle 0\rangle}\right]^{2\cdot r+1}\right]} \qquad AF^{\langle 1\rangle} := \overline{\left[\sum_s b_s\cdot\left[\frac{4}{\pi}\cdot x^{\langle 1\rangle}\right]^{2\cdot s}\right]}$$

This completes the minimum-magnitude-of-error design step for the sine and cosine functions over a +/-45 degree +/-α range. Now we evaluate our errors.

```
************************************************************************
                         COEFFICIENT EVALUATION
```

ERROR := REF - AF                          These are approximation
                                           errors.

$\epsilon'_i := if\left[\epsilon_i \approx 0, \max\left[\,\overline{[|ERROR^{\langle i \rangle}|]}\,\right], |\epsilon_i|\right]$      For convenience in graphing errors, these $\epsilon'$ functions are useful.

The extremal-error outline graphs:

$EX_{k,i} := if\left[k \approx K - 1, 0, if\left[ERROR_{k-1,i} \geq ERROR_{k,i}, \epsilon'_i, -\epsilon'_i\right]\right]$ Now we extract the frequencies at which the extremal values occur, sort them, write them into memory, and list the rounded coefficients:

$FILTER_{k,i} := if\left[k \approx 0, 1, if\left[k \approx K - 1, 1, if\left[EX_{k-1,i} \approx -EX_{k,i}, 1, 0\right]\right]\right]$ $MATRIX_{k,i} := \frac{4}{\pi} \cdot X_{k,i} \cdot FILTER_{k,i}$     $MATRIX1_{k,i-2} := ERROR1_{k,i} \cdot FILTER_{k,i}$ $XE0_m :=$                                    $XE1_p :=$
  reverse(csort(MATRIX,2))$_{m,0}$              reverse(csort(MATRIX,3))$_{p,1}$ RXE0$_m$ := reverse(sort(XE0))$_m$             RXE1$_p$ := reverse(sort(XE1))$_p$
RXE0$_0$ := 1 - α                              RXE1$_0$ := 1 + α
SXE0 := sort(RXE0)                             SXE1 := sort(RXE1)

$SXE0 = \begin{bmatrix} 0.2412438845 \\ 0.6330824364 \\ 0.747125 \end{bmatrix}$         $SXE1 = \begin{bmatrix} 0 \\ 0.6448260763 \\ 1.1204772505 \\ 1.252875 \end{bmatrix}$

δ := READ(DELTA)

δ' := ε'$_0$ - ε'$_1$                          δ = -8.5970145861 $10^{-7}$

δ' = -9.9130610717 $10^{-7}$

δ' - δ = -1.3160464857 $10^{-7}$               WRITE(DELTA) := δ'

δα := READ(DELTA_ALPHA)       δα = -0.000125
                                              WRITEPRN(XA) := SXE0

δα' := SGNCHG(δ',δ)·δα·if(SGNCHG(δ',δ) ≈ 1,1,0.5)
                                              WRITEPRN(YB) := SXE1

α = 0.252875        δα' = 0.0000625            WRITE(DELTA_ALPHA) := δα

α' := α + δα'       α' = 0.2529375             WRITE(ALPHA) := α'

15. The rounded coefficients expressed as octal numbers:

$$2^3 \cdot a = \begin{bmatrix} 647e5ah \\ -a178dh \end{bmatrix}$$

$$2^3 \cdot b = \begin{bmatrix} 7ffe77h \\ -2769f8h \\ 1ed24h \end{bmatrix}$$

The rounded coefficients expressed as decimal numbers:

$$a = \begin{bmatrix} 0.7851059437 \\ -0.0788437128 \end{bmatrix}$$

$$b = \begin{bmatrix} 0.9999531507 \\ -0.3079214096 \\ 0.0150494576 \end{bmatrix}$$

The rounded coefficients are now defined and evaluated. Next, we apply them to our functions that we wish to synthesize over the full $2\pi$ range.

********************************************************************

PERFORMANCE-EVALUATION OF THE SYNTHESIZED FUNCTIONS $$\theta_k := 2\pi \cdot \frac{k}{K} \qquad \rho_k := \frac{k}{K}$$

The sample pulse occurs at time "k", so we convert that into an equivalent angle in the oscillator cycle.

The 360-degree cycle of the output waveform is divided into segments which are functions of $\alpha$ and $\rho$. The "housekeeping" variable is Q:

$$Q_k := if\left[\rho_k \le \frac{1+\alpha}{8}, 0, if\left[\rho_k \le \frac{3-\alpha}{8}, \frac{1}{4}, if\left[\rho_k \le \frac{5+\alpha}{8}, \frac{1}{2}, if\left[\rho_k \le \frac{7-\alpha}{8}, \frac{3}{4}, 1\right]\right]\right]\right]$$

With Q and $\rho$ we generated a "converted" phase angle, $\phi$.

$$\phi_k := 8 \cdot [\rho_k - Q_k] \qquad \text{The "converted" phase angle.}$$

The sine and cosine functions for the "converted" angle, $\phi$, are, respectively:

$$S := \overline{\left[\sum_r a_r \cdot \phi^{2 \cdot r - 1}\right]} \qquad C := \overline{\left[\sum_s b_s \cdot \phi^{2 \cdot s}\right]}$$

The synthesized cosine waveform is described by SC. The synthesized sine waveform is obtained from a 90 degree phase.

$$SC_k := if[\text{mod}[4 \cdot Q_k, 2] = 0, C_k, S_k] \cdot if\left[\left[Q_k < \frac{3}{4}\right] \cdot [Q_k > 0], -1, 1\right]$$

$$SS_k := \frac{1}{2 \cdot \sin\left[2 \cdot \frac{\pi}{K}\right]} \cdot [if[k = 0, SC_{k-1}, SC_{k-1}] - if[k = K-1, SC_0, SC_{k-1}]]$$

********************************************************************

TOTAL PERFORMANCE EVALUATION $$c\epsilon := \overline{\cos(2\pi\cdot\rho)} - SC \qquad FFT\cos := 20\cdot Re\left[\overline{\log(fft(\cos(2\pi\cdot\rho)))}\right]$$
$$s\epsilon := \overline{\sin(2\pi\cdot\rho)} - SS \qquad FFT\sin := 20\cdot Re\left[\overline{\log(fft(\sin(2\pi\cdot\rho)))}\right]$$

$$c\epsilon dB := 20\cdot\log\left[\max\left[\left(\overline{|c\epsilon|}\right)\right]\right] \qquad CFFT := FFT\cos - \max(FFT\cos)$$
$$SFFT := FFT\sin - \max(FFT\sin)$$

$$FFTc\epsilon := 20\cdot Re\overline{[\log(fft(c\epsilon))]} - \max(FFT\cos) \qquad \max(FFTc\epsilon) = -91.6520302413$$

5

$$FFTs\epsilon := 20\cdot Re\overline{[\log(fft(s\epsilon))]} - \max(FFT\sin) \qquad \max(FFTs\epsilon) = -71.4448561515$$

APPENDIX III.

FORTRAN PROGRAM FOR COMPLEX DEMODULATION

```
c
c Purpose: implements complex demod for QRS project
c design by Dr. S. White
c This version will read intermediate parameters from files
c
c
c Parameters:
c
c
c       ffast           freq of "fast" clock, sampling rate !
c       fslow           freq of ADC sample "slow" clock
c       fdrive          freq of drive curent (at sampling rate of
c                       fast clock
c       xdrive          sequence of drive current samples
c       xslow           sequence of slow clock samples
c       acap            number of fast clock cycles between beginnings
c                       of fork-drive cycle and arrival of an
c                       ADC output sample
c       bcap            number of fast clock cycles in one cycle of
c                       fork drive current
c       c(k)            chebychev coefficients for estimating theta
c       a(k),b(k)       chebychev coefficients for estimating sinphi,cosphi
c       theta           angle*2*pi in degrees  for demod freq
c       phi             principle angle of theta (abs(phi .le. 45 degrees)
c       sinphi          sin of phi
c       cosphi          cos of phi
c       iq              which octal (half quadrant) theta is is
c                       iq .lt. 5
c       nfast           # fast clock cycles generated
c       nslow           # slow clock samples  generated
c       nf              sample index at fast rate
c       ns              sample index at slow rate
c       nc              sample index out of 12 bit binary counter
c       nmaxc           maximum decimal value in 12 bit binary counter
c       nmaxd           ratio of ffast to fdrive
c       nmaxs           ratio of ffast to fslow
c       iflagd          flag set to 1 if binary counter reset
c       bapprox         approx of bcap by cheb c coefficients
c       ib              # bits for fixed point simulation (exclusive of sign)
c
c
c Initialization
c
        character*40 files
        parameter(ncc=5,nbb=3,naa=2,ntrans1=5,idum=-1,mm=3)
        double precision ffast,fslow,fdrive,pi,acapp,thetap,xx
        double precision acap,bcap,theta,c(0:ncc),a(0:naa),b(0:nbb)
        double precision bapprox,phi,sinphi,cosphi,temp,phisq,sb(-1:0)
        double precision ys,yc,fmax,fmin,aa,u,ran1d,ynoise,aacap,bias
        double precision ys1,yc1,theta1,thetap1,ydif,rem,sa(-mm:0)
        data ffast,fslow/33.333333333333d+06,32000.d+0/
c       data ffast,fslow/33.333500d+06,32000.d+0/
```

```
              data c/3.9326475859d+0,-6.4175332785d+0,5.5623742342d-0,
     &-2.7007945776d+0,0.6965467334d+0,-0.0745492578d+0/
              data b/1.0d+00,-0.3084244728d+0,0.0158504248d+0,
     &-0.0003191829d+00/
              data a/0.7853942513d+0,-0.0807139874d+0,0.0024271011d+0/
              data pi/3.14159265358979323/
              fmax=40.d-09/(2.*pi)
              fmin=0.0

100           format(e25.15)
200           format(i12)
300           format(e25.15,1x,e25.15)
400           format(i12,1x,e25.15)
c
c
c
c Prompt
c
              print *,'enter # slow clock samples to generate,ntrans'
              read *,nslow,ntrans
              print *,'enter ib,fdrive,nrset'
              read *,ib,fdrive,nrset
              print *,'enter file special (ken_1.da)'
              read *,files
c
c TEMP
c
              open(80,file=files,status='old')

c
c
c
c computation:
c
              nfast=nint(nslow*ffast/fslow)
              nmaxc=2**12
              nmaxd=dnint(ffast/fdrive)
              nmaxdd=nmaxd
              nmaxs=dnint(ffast/fslow)
              ns=-1
              nd=0
              nff=-1
              namax=3
              nacount=3
              ircount=-1
              sb(0)=nmaxd
              sb(-1)=nmaxd c
c check on relationship between drive and fast clock cycles
c
              call fdivsub(ffast,fdrive,idiv,rem)
c
c
c LOOP at fast rate *****************************************
c
              do 10 nf=0,nfast-1 c
c 12 bit binary counter at fast rate
c c
c check drive for reset
c
              nff=nff+1
              if(mod(nff,nmaxdd) .eq. 0) then
c
c read out value of counter as b and reset counter
c
                       ireset=1
                       sb(0)=nc+1
                       nd=0
```

```
c
c if ratio of ffast/frive is not an integer, then model nmaxdd as a r.v.
c
                                nrcount=nrcount+1
                                if(mod(nrcount,nrset) .eq. 0) then
                                        nff=0
                                        u=ran1d(idum)
                                        if(nmaxd .eq. idiv ) then
                                                if(u .lt. rem) then
                                                    nmaxdd=nmaxd+1
                                                else
                                                    nmaxdd=nmaxd
                                                end if
                                        end if
                                        if(nmaxd .eq. idiv+1) then
                                                if(u .lt. rem) then
                                                    nmaxdd=nmaxd
                                                else
                                                    nmaxdd=idiv
                                                end if
                                        end if
                                end if else
                                nd=nd+1
                        end if nc=mod(nd,nmaxc)

if(mod(nf,nmaxs) .eq. 0) then
c
c*********************************************************************
c
c do all further processing at slow clock rate
c
c*********************************************************************
c
c
                                ns=ns+1
                                if(mod(ns,ntrans) .eq. 0) then
                                        print *,ns
                                end if
                        if(ireset .eq. 1) then namaxold=namax
                                        namax=nacount
                                        if(namaxold .eq. namax) then
                                                bcap=sb(0)
                                                call shiftd1(sb,2)
                                                iflag=0
                                        else
                                                iflag=1
                                                namax=namaxold
                                        end if
                                        nacount=0
                                        ireset=0
                        else
                                nacount=nacount+1
                                if((iflag .eq. 1).and.(nacount .eq. 1)) then
                                        bcap=sb(0)
                                        call shiftd1(sb,2)
                                        iflag=0
                                end if
                        end if
                                acap=sa(-namax)
                                aacap=acap
c                               acap=acap/2.**11
                                call shiftd1(sa,mm+1)
                                sa(0)=nc
c
c TEMP
c
                                read(80,100) sa(0)
                                bapprox=1.0/(ffast/fdrive)
```

```
c
c compute approximation of   1/b by chebychev approximation
c
c
c                              temp=bcap/2.**11
c                              call chebapprox(temp,bapprox,ncc,c,ib)
c
c
c compute theta (a/b)
c
                               theta=acap*bapprox
                                    call roundd(theta,ib,xx)
                                    theta=xx if(theta .gt. 1.0) then
c              print *,'ERROR theta too large'
               theta=theta-1.0
        end if c
c convert to phi
c
                               call prangle(theta,phi,iq,ib)
c c find sin and cos of phi
c
c (1) first sin of phi*pi/4   radians
c
                               phisq=phi*phi
                                    call roundd(phisq,ib,xx)
                                    phisq=xx
                               call chebapprox(phisq,sinphi,naa,a,ib)
                               sinphi=sinphi*phi
                                    call roundd(sinphi,ib,xx)
                                    sinphi=xx
c
c (2) then cos
c
                               call chebapprox(phisq,cosphi,nbb,b,ib)
c
c logic for correcting phi
c
                               call oddevn(iq,iout)
                               if(iout .eq. 1) then
                                    temp=sinphi
                                    sinphi=cosphi
                                    cosphi=temp
                               end if if((iq .eq. 2).or.(iq .eq. 3)) then
                                    sinphi=-sinphi
                               end if
                               if ((iq .eq. 1).or.(iq .eq. 2)) then
                                    cosphi=-cosphi
                               end if c
c ideal sin and cos
c
                               thetap=theta*2.*pi
                               ys=dsin(thetap)
                               ydif=ys-sinphi
                               yc=dcos(thetap)

c
c
c write out results
c
c
c
c                              if(ns .ge. ntrans1) then
c                                   write(25,100) dfloat(nmaxdd)
```

```
c                             write(26,100) aacap
c                             write(27,100) bcap
c                             write(28,100) phi
c                             write(40,300) thetap,sinphi
c                             write(41,300) thetap,cosphi
                              write(30,100) sinphi
                              write(31,100) cosphi
                              write(50,100) ys
                              write(51,100) yc
c                      end if
               end if 10      continue
        limit=20
        do 98 n=0,limit
               write(50,100) 0.0
               write(51,100) 0.0
               write(30,100) 0.0
               write(31,100) 0.0
98      continue end subroutine roundd(x,ib,out)
c
c Note: ib must be 30 or less! Otherwise integer overflow
c Purpose: rounds decimal fraction x to ib bits and
c converts back to decimal fraction representation
c
c
c Parameters:
c
c
c       x  input decimal fraction (floating point number)
c       out rounded version of x
c       ib # bits to round
c
c Initialization:
c
               double precision x,out,i c
c
c
               if(x .lt. 0) then
               i=dint(-.5+(2**ib)*x)
               else
               i=dint(.5+(2**ib)*x)
               end if
               out=dfloat(i)/(2**ib)
               return
               end subroutine shiftdl(yy,mdel)
c
c
c Purpose: shifts the data vector yy, so as to act like a fifo buffer.
c
c Equation:
c  y(n-1)=y(n)
c
c Parameters:
c
c        yy(i)         data vector i=1,mdel ;is time delay index
c        mdel          dimension of vector, i.e. # delays
c
c
c Initialization:
c
               double precision yy(-(mdel-1):0)
c
c Computation:
c
               do 10 i=-(mdel-1),-1
                         yy(i)=yy(i+1)
```

```
10           continue
                         yy(0)=0.0
             return
             end subroutine prangle(theta,phi,iq,ib)
c
c
c Purpose:
c converts angle theta into "principle" angle phi, such that
c abs(phi) .le. 45 degrees
c
c
c Parameters:
c
c
c       theta           original angle, in radians
c       phi             principle angle , the angle is phi*pi/4 in radians
c       iq              which octal (half quadrant) theta is
c                       iq .lt. 5
c       ib              # bits for fixed point
c
c
c
c Initialization:
c
             double precision theta,phi,pi,xx
             integer floor1
             pi=3.14159265358979323
c
c
c
c Computation:
c
c
             iq=floor1(theta*4.+.5)
             phi=theta*8.-2.*iq
             call roundd(phi,ib,xx)
             phi=xx
             if((iq .lt. 0).and.(iq .gt. 4)) print *,'ERROR PRANGLE.f'
             if(dabs(phi) .gt. 1.0) print *,'ERROR PRANGLE.f'
             return
             end subroutine fdivsub(xlarge,f,i,dif)
c
c
c Purpose: finds integer divisor of a large number, and remainder
c
c       xlarge          large number
c       fdiv            divisor (must be positive)
c
c
c Initialization
c
             double precision xlarge,f,r,dif
c
c
c r=xlarge/f
             i=dint(r)
             dif=r-i
             return
             end subroutine oddevn(iq,iout)
c
c
c Purpose: computes whether input is odd or even
c
c
c
c Parameters:
c
```

```
c
c       iq                              input value
c
c       iout                            1 if odd, 2 if even
c
c
c
        i=abs(iq)
        if(mod(i,2).eq. 0) then
                iout=2
        else
                iout=1
        end if
        return
        end program chebapproxt
c
c
c Purpose: tests routine which computes chebyshev approximation to sqrt
c
c
c Parameters:
c
c       y       input,  y<1
c       x       output          x=sqrt(y)
c       m       order of approx
c       a       cheb coefficients
c
c Initialization
c
        parameter(max=10)
        character*40 filech
        double precision y,x,a(0:max),yy
100     format(e25.15)
c
c
c prompt
c
        print *,'enter order,filech,y'
        read *,m,filech,y
        if(dabs(y) .gt. 1.0) print *,'error, y out of range'
        open(22,file=filech,status='old')
c
c read cheb coeff
c
        read(22,100) (a(k),k=0,m-1)
c
c note: must form yy=1-y, but answer x is approximation to sqrt(y)
c not sqrt(1-y)
c
        yy=1.0-y
        call chebapprox(yy,x,m-1,a)
        print *,'x=sqrt(y)= ',x
        y=dsqrt(y)
        print *,'srqt(y)= ',y
        end function floor1(xin)
c
c
c Purpose: provides an integer smaller or equal to the given
c floating point value.
c c similar to stans mathcad version
c c
c Parameters:
c
c       xin             floating point value in
c
        double precision xin,x
        integer floor1
c
c
```

```
        x=xin
        floor1=dint(x)
        return
        end subroutine chebapprox(y,x,m,a,ib)
c
c
c Purpose: computes chebyshev approximation
c
c
c Parameters:
c
c       y       input
c       x       output
c       m       order of approx
c       a       cheb coefficients
c       ib      # fixed points bits
c
c Initialization
c
        double precision y,x,a(0:m),sum,xx,temp
c
c
c do nested power series expansion
c
        sum=0.0
        do 10 k=m,1,-1
                temp=(sum+a(k))
                        call roundd(temp,ib,xx)
                        temp=xx
                sum=temp*y
                        call roundd(sum,ib,xx)
                        sum=xx
10      continue
        x=sum+a(0)
                        call roundd(x,ib,xx)
                        x=xx
        return
        end
```

What is claimed is:

1. A method of demodulating a digital signal by a reference frequency signal, said digital signal including a series of digital values, said reference frequency signal including a series of phase angle values, each of said digital values having a corresponding one of said phase angle values, said method comprising the steps of:
  a) computing, with computing means, a numerical approximation of a sinusoidal function of each phase angle value;
  b) multiplying, with a multiplier, each digital sample by the numerical approximation of the sinusoidal function of the phase angle corresponding to said each digital value, to produce a series of products of said sinusoidal function; and
  c) digitally filtering, with a filter, the series of products.

2. The method as claimed in claim 1, wherein said numerical approximation is a Chebychev-derived approximation.

3. The method as claimed in claim 1, wherein said numerical approximation of said sinusoidal function is computed by comparing, with a comparator, said each phase angle to predefined angular limits, transforming, with transforming means, said each phase angle by a linear transformation to produce a transformed phase angle in response to the comparing of said phase angle to the predefined angular limits, and computing, with computing means, said numerical approximation for said sinusoidal function as either an even function or an odd function of said transformed phase angle in response to the comparing of said each phase angle to the predefined angular limits.

4. The method as claimed in claim 3, wherein said even function is a polynomial of said transformed phase angle, and said odd function is also a polynomial of said transformed phase angle.

5. The method as claimed in claim 3, wherein said even function is used for said numerical approximation of said sinusoidal function over a greater angular range of said each phase angle than said odd function.

6. A method of demodulating a digital signal by a reference frequency signal, said digital signal including a series of digital values, said reference frequency signal including a series of phase angle values, each of said digital values having a corresponding one of said phase angle values, said method comprising the steps of:
  a) computing, with computing means, a numerical approximation of a sinusoidal function of each phase angle value; and
  b) multiplying, with a multiplier, each digital value by the numerical approximation of said sinusoidal function of the phase angle corresponding to said each digital value, to produce a series of products of said sinusoidal function;
  wherein said numerical approximation is computed by comparing, with a comparator, said each phase angle to predefined angular limits, transforming, with transforming means, said each phase angle by a linear transformation to produce a transformed phase angle in response to the comparing of said phase angle to the predefined angular limits, and computing, with computing means, said numerical approximation of said sinusoidal function as either an even function or an odd function of said transformed phase angle in response to the comparing of said each phase angle to the predefined angular limits.

7. The method as claimed in claim 6, wherein said even function is a polynomial of said transformed phase angle, said odd function is also a polynomial of said transformed phase angle, and said even function is used for said numerical approximation of said sinusoidal function over a greater angular range of said each phase angle than said odd function.

8. A method of demodulating an analog signal by a reference frequency signal to produce a demodulated signal, said method comprising the steps of:
   a) sampling, with a sampler, said analog signal to produce a digital sample;
   b) determining, with a determiner, a phase angle of said reference frequency signal existing when said analog signal is sampled to produce said digital sample;
   c) computing, with computing means, a numerical approximation of a sinusoidal function of said phase angle; and
   d) multiplying, with a multiplier, said digital sample by said numerical approximation of said sinusoidal function of said phase angle, to produce a product that is a sample of said demodulated signal.

9. The method as claimed in claim 8, further comprising the step of digitally filtering, with a filter said demodulated signal.

10. The method as claimed in claim 8, wherein said numerical approximation of said sinusoidal function of said phase angle is a Chebychev-derived approximation.

11. The method as claimed in claim 8, wherein said phase angle is determined by counting cycles of a clock signal in a counter, latching a count from said counter into a latch when a transition occurs in said reference frequency signal, and determining said phase angle from said count latched in said latch.

12. The method as claimed in claim 11, wherein a number of cycles of said clocking signal occur in a cycle of said reference frequency signal, and said phase angle is determined from said count latched in said latch by dividing, with a divider, said count by said number.

13. The method as claimed in claim 12, wherein said count latched in said latch is divided by said number by computing, with computing means, a polynomial approximation of the reciprocal of said number, and multiplying, with a multiplier, the polynomial approximation for the reciprocal of said number by said count latched in said latch.

14. The method as claimed in claim 8, wherein said numerical approximation of said sinusoid function is computed by comparing, with a comparator, said phase angle to predefined angular limits, transforming, with transforming means, said phase angle by a linear transformation to produce a transformed phase angle in response to the comparing of said phase angle to the predefined angular limits, and computing, with computing means, said numerical approximation as either an even or odd function of said transformed phase angle in response to the comparing of said phase angle to the predefined angular limits.

15. The method as claimed in claim 14, wherein said even function is a polynomial of said transformed phase angle, said odd function is also a polynomial of said transformed phase angle, and said even function is used for said numerical approximation over a greater angular range of said phase angle than said odd function.

16. The method as claimed in claim 8, further including the step of computing, with computing means, a differential of said sinusoidal function to produce a quadrature-phase function in phase quadrature with said sinusoidal function, and multiplying, with a multiplier, said sampled value by said differential to produce a product that is a sample of a quadrature-phase demodulated signal.

17. A method of demodulating a digital signal by a reference frequency signal, said digital signal including a series of digital values, said reference frequency signal including a series of phase angle values, each of said digital values having a corresponding one of said phase angle values, said method comprising the steps of:
   a) computing, with computing means, a numerical approximation of a pair of sinusoidal functions of each phase angle value, said pair of sinusoidal functions being in phase quadrature with each other; and
   b) multiplying, with a multiplier, each digital value by the numerical approximation of each sinusoidal function of the phase angle corresponding to said each digital value to produce a series of products of each of said sinusoidal functions.

18. The method as claimed in claim 17, further comprising the steps of digitally filtering, with a filter, the series of products of a first one of said sinusoidal functions, and digitally filtering, with a filter, the series of products of a second one of said sinusoidal functions.

19. The method as claimed in claim 18, wherein the numerical approximation of one of said sinusoidal functions is computed, with computing means, as a differential of the other of said sinusoidal functions.

20. The method as claimed in claim 19, wherein the numerical approximation of said other sinusoidal function is delayed, with a delayer, by one interval between said digital values before being multiplied, with a multiplier, by said each digital value, and wherein the numerical approximation of said other sinusoidal function is further delayed, with a delayer, by another interval between said digital values so that said differential is computed as the difference in the numerical approximation of said other sinusoidal function over two intervals between said digital values.

21. The method as claimed in claim 17, wherein said numerical approximation of one of said sinusoidal functions is a Chebychev-derived approximation.

22. The method as claimed in claim 17, wherein said numerical approximation of one of said sinusoidal functions is computed by comparing, with a comparator, said each phase angle to predefined angular limits, transforming, with transforming means, said each phase angle by a linear transformation to produce a transformed phase angle in response to the comparing of said phase angle to the predefined angular limits, and computing, with computing means, said numerical approximation of said one of said sinusoidal functions as either an even function or an odd function of said transformed phase angle in response to the comparing of said each phase angle to tile predefined angular limits.

23. The method as claimed in claim 22, wherein said even function is a polynomial of said transformed phase angle, said odd function is also a polynomial of said transformed phase angle, and said even function is used for said numerical approximation of said one of said sinusoidal functions over a greater angular range of said each phase angle than said odd function.

24. A system for demodulating an analog signal by a reference frequency signal, and producing a digitized demodulated signal synchronized to a high-speed system clock, said system comprising, in combination:

an analog-to-digital converter for producing digital samples of said analog signal at a predetermined sampling frequency synchronized to said system clock;

a counter clocked by said system clock for counting during at least one cycle of said system clock;

means including a set of latches connected to said counter and responsive to said reference frequency signal for determining a number of counts of said counter in a period of said reference frequency, and determining a number of counts into a period of said reference frequency when said analog signal is sampled by said analog-to-digital converter;

means for computing a phase angle value for each of said digital samples from said number of counts of said counter in a period of said reference frequency, and said number of counts into a period of said reference frequency when said analog signal is sampled by said analog-to-digital converter;

means for computing a numerical approximation of a pair of sinusoidal functions of each phase angle value, said pair of sinusoidal functions being in phase quadrature with each other;

means for multiplying each digital sample by the numerical approximation of each sinusoidal function of the phase angle for said each digital sample to produce a series of products of each of said sinusoidal functions;

a first digital filter for digitally filtering the series of products of a first one of said sinusoidal functions; and a second digital filter for digitally filtering the series of products of a second one of said sinusoidal functions.

25. The system as claimed in claim 24, wherein said means for computing a numerical approximation of a pair of sinusoidal functions of each phase angle value includes means for computing the numerical approximation of one of said sinusoidal functions as a differential of the other of said sinusoidal functions.

26. The system as claimed in claim 25, wherein said means for computing the numerical approximation of one of said sinusoidal functions as a differential of the other of said sinusoidal functions includes means for delaying said other sinusoidal function by one period of said sampling frequency before being multiplied by said means for multiplying, and means for delaying the numerical approximation of said other sinusoidal function by a second period of said sampling frequency so that said differential is computed as the difference in the numerical approximation of said other sinusoidal function between two periods of said sampling frequency.

27. The system as claimed in claim 25, wherein said means for computing a numerical approximation of a pair of sinusoidal functions of each phase angle value includes means four computing the numerical approximation of said other of said sinusoidal functions by comparing said each phase angle to predefined angular limits, transforming said each phase angle by a linear transformation to produce a transformed phase angle in response to the comparing of said phase angle to the predefined angular limits, and computing said numerical approximation of said one of said sinusoidal functions as either an even function or an odd function of said transformed phase angle in response to the comparing of said each phase angle to the predefined angular limits.

28. The system as claimed in claim 27, wherein said even function is a polynomial of said transformed phase angle, said odd function is also a polynomial of said transformed phase angle, and said even function is used for said numerical approximation of said other of said sinusoidal functions over a greater angular range of said each phase angle than said odd function.

* * * * *